United States Patent
Farnworth et al.

(10) Patent No.: US 7,498,675 B2
(45) Date of Patent: Mar. 3, 2009

(54) SEMICONDUCTOR COMPONENT HAVING PLATE, STACKED DICE AND CONDUCTIVE VIAS

(75) Inventors: Warren M. Farnworth, Nampa, ID (US); Alan G. Wood, Boise, ID (US); William M. Hiatt, Eagle, ID (US); James M. Wark, Boise, ID (US); David R. Hembree, Boise, ID (US); Kyle K. Kirby, Boise, ID (US); Pete A. Benson, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 184 days.

(21) Appl. No.: 11/701,927

(22) Filed: Feb. 2, 2007

(65) Prior Publication Data

US 2007/0132104 A1 Jun. 14, 2007

Related U.S. Application Data

(60) Continuation of application No. 11/333,662, filed on Jan. 17, 2006, now Pat. No. 7,224,051, which is a continuation of application No. 10/730,333, filed on Dec. 8, 2003, now Pat. No. 7,060,526, which is a division of application No. 10/403,937, filed on Mar. 31, 2003, now Pat. No. 6,841,883.

(51) Int. Cl.
*H01L 23/34* (2006.01)
(52) U.S. Cl. .......................... 257/723; 257/777
(58) Field of Classification Search ................ 257/678, 257/777, 723, 774
See application file for complete search history.

(56) References Cited

U.S. PATENT DOCUMENTS 3,761,782 A 9/1973 Youmans (Continued)

FOREIGN PATENT DOCUMENTS

JP 4-320362 11/1992

(Continued)

OTHER PUBLICATIONS

Dexter Electronic Material, Hysol® 4450 Material Properties, spec sheet, pp. 1-2, Aug. 20, 1999.

(Continued)

*Primary Examiner*—Roy K Potter
(74) *Attorney, Agent, or Firm*—Stephen A. Gratton

(57) ABSTRACT

A semiconductor component includes a base die and a secondary die stacked on and bonded to the base die. The base die includes conductive vias which form an internal signal transmission system for the component, and allow the circuit side of the secondary die to be bonded to the back side of the base die. The component also includes an array of terminal contacts on the circuit side of the base die in electrical communication with the conductive vias. The component can also include an encapsulant on the back side of the base die, which substantially encapsulates the secondary die, and a polymer layer on the circuit side of the base die which functions as a protective layer, a rigidifying member and a stencil for forming the terminal contacts. A method for fabricating the component includes the step of bonding singulated secondary dice to base dice on a base wafer, or bonding a secondary wafer to the base wafer, or bonding singulated secondary dice to singulated base dice.

20 Claims, 27 Drawing Sheets

U.S. PATENT DOCUMENTS

| | | |
|---|---|---|
| 4,348,253 A | 9/1982 | Subbarao et al. |
| 4,808,273 A | 2/1989 | Hua et al. |
| 4,899,921 A | 2/1990 | Bendat et al. |
| 5,138,434 A | 8/1992 | Wood et al. |
| 5,229,647 A | 7/1993 | Gnadinger |
| 5,299,092 A | 3/1994 | Yaguchi et al. |
| 5,399,898 A | 3/1995 | Rostoker |
| 5,437,915 A | 8/1995 | Nishimura et al. |
| 5,468,681 A | 11/1995 | Pasch |
| 5,495,667 A | 3/1996 | Farnworth et al. |
| 5,543,658 A | 8/1996 | Hosokawa et al. |
| 5,686,317 A | 11/1997 | Akram et al. |
| 5,686,352 A | 11/1997 | Higgins, III |
| 5,851,911 A | 12/1998 | Farnworth |
| 5,888,883 A | 3/1999 | Sasaki et al. |
| 5,897,337 A | 4/1999 | Kata et al. |
| 5,950,070 A | 9/1999 | Razon et al. |
| 6,060,373 A | 5/2000 | Saitoh |
| 6,080,602 A | 6/2000 | Tani et al. |
| 6,087,845 A | 7/2000 | Wood et al. |
| 6,097,087 A | 8/2000 | Farnworth et al. |
| 6,107,109 A | 8/2000 | Akram et al. |
| 6,114,240 A | 9/2000 | Akram et al. |
| 6,118,179 A | 9/2000 | Farnworth et al. |
| 6,130,111 A | 10/2000 | Ikuina et al. |
| 6,153,448 A | 11/2000 | Takahashi et al. |
| 6,169,329 B1 | 1/2001 | Farnworth |
| 6,177,295 B1 | 1/2001 | De Samber et al. |
| 6,221,751 B1 | 4/2001 | Chen et al. |
| 6,233,185 B1 | 5/2001 | Beffa et al. |
| 6,235,554 B1 | 5/2001 | Akram et al. |
| 6,251,703 B1 | 6/2001 | Van Campenhout et al. |
| 6,252,299 B1 | 6/2001 | Masuda et al. |
| 6,271,056 B1 | 8/2001 | Farnworth et al. |
| 6,281,131 B1 | 8/2001 | Gilton et al. |
| 6,294,837 B1 | 9/2001 | Akram et al. |
| 6,303,981 B1 | 10/2001 | Moden |
| 6,303,997 B1 | 10/2001 | Lee |
| 6,310,390 B1 | 10/2001 | Moden |
| 6,313,531 B1 | 11/2001 | Geusic et al. |
| 6,314,013 B1 | 11/2001 | Ahn |
| 6,326,242 B1 | 12/2001 | Brooks |
| 6,326,689 B1 | 12/2001 | Thomas |
| 6,326,698 B1 | 12/2001 | Akram |
| 6,330,158 B1 | 12/2001 | Akram |
| 6,338,980 B1 | 1/2002 | Satoh |
| 6,340,845 B1 | 1/2002 | Oda |
| 6,359,456 B1 | 3/2002 | Hembree et al. |
| 6,362,529 B1 | 3/2002 | Sumikawa et al. |
| 6,368,896 B2 | 4/2002 | Farnworth et al. |
| 6,368,930 B1 | 4/2002 | Enquist |
| 6,372,624 B1 | 4/2002 | Farnworth et al. |
| 6,384,487 B1 | 5/2002 | Smith |
| 6,400,172 B1 | 6/2002 | Akram et al. |
| 6,432,752 B1 | 8/2002 | Farnworth |
| 6,440,772 B1 | 8/2002 | Smith |
| 6,441,483 B1 | 8/2002 | Akram |
| 6,451,624 B1 | 9/2002 | Farnworth et al. |
| 6,465,877 B1 | 10/2002 | Farnworth et al. |
| 6,472,735 B2 | 10/2002 | Isaak |
| 6,482,576 B1 | 11/2002 | Farnworth et al. |
| 6,482,674 B1 | 11/2002 | Kinsman |
| 6,501,165 B1 | 12/2002 | Farnworth et al. |
| 6,506,625 B1 | 1/2003 | Moden |
| 6,507,114 B2 | 1/2003 | Hui et al. |
| 6,524,346 B1 | 2/2003 | Farnworth |
| 6,544,902 B1 | 4/2003 | Farnworth |
| 6,549,821 B1 | 4/2003 | Farnworth et al. |
| 6,569,762 B2 | 5/2003 | Kong |
| 6,577,013 B1 | 6/2003 | Glenn et al. |
| 6,582,992 B2 | 6/2003 | Poo et al. |
| 6,614,104 B2 | 9/2003 | Farnworth et al. |
| 6,812,549 B2 | 11/2004 | Umetsu et al. |
| 6,841,883 B1 * | 1/2005 | Farnworth et al. .......... 257/777 |
| 6,903,442 B2 | 6/2005 | Wood et al. |
| 6,903,443 B2 | 6/2005 | Farnworth et al. |
| 6,906,418 B2 | 6/2005 | Hiatt et al. |
| 6,908,784 B1 | 6/2005 | Farnworth et al. |
| 6,936,913 B2 | 8/2005 | Akerling et al. |
| 6,964,915 B2 | 11/2005 | Farnworth et al. |
| 7,060,526 B2 | 6/2006 | Farnworth et al. |
| 7,078,266 B2 | 7/2006 | Wood et al. |
| 7,081,665 B2 | 7/2006 | Wood et al. |
| 7,224,051 B2 * | 5/2007 | Farnworth et al. .......... 257/678 |
| 2002/0017710 A1 | 2/2002 | Kurashima et al. |
| 2004/0235270 A1 | 11/2004 | Noma et al. |

FOREIGN PATENT DOCUMENTS

| | | |
|---|---|---|
| JP | 4-320365 | 11/1992 |
| JP | 5-67726 | 3/1993 |
| JP | 405082720 A | 4/1993 |
| JP | 10-79362 | 3/1998 |
| JP | 2000-31185 | 1/2000 |

OTHER PUBLICATIONS

Dexter Electronic Material, Hysol® 4451 Material Properties, spec sheet, pp. 1-2, Aug. 20, 1999.

Wafer Size CSP Packaging by VPES, Japan Rec Co., Ltd, advertising material, pp. 1-4, 1998.

Parylene Coating, advertising for Speciality Coating Systems, pp. 1-3, date unknown.

Advanced Coating Parylene Conformal Coating Specialists, advertising material, pp. 1-7, 1998.

David Francis & Linda Jardine, "Thin, Wafer-Level Package is Made Without Damaging Die", Chip Scale Review, May/Jun. 2002, p. 70.

Jeffrey C. Demmin, "More Thinning at ICAPS", Advanced Packaging, Mar. 13, 2002.

* cited by examiner

SEMICONDUCTOR COMPONENT HAVING PLATE, STACKED DICE AND CONDUCTIVE VIAS

This application is a continuation of Ser. No. 11/333,662 filed Jan. 17, 2006, U.S. Pat. No. 7,224,051, which is a continuation of Ser. No. 10/730,333 filed Dec. 08, 2003, U.S. Pat. No. 7,060,526, which is a division of Ser. No. 10/403,937 filed Mar. 31, 2003, U.S. Pat. No. 6,841,883. This application is related to Ser. No. 10/962,931 filed Oct. 11, 2004, U.S. Pat. No. 6,998,717, and to Ser. No. 11/497,699 filed Aug. 02, 2006.

FIELD OF THE INVENTION

This invention relates generally to semiconductor manufacture and packaging. More particularly, this invention relates to multi-dice semiconductor components, to methods for fabricating the components, and to systems incorporating the components.

BACKGROUND OF THE INVENTION

Semiconductor manufacturers have developed components, such as packages and BGA devices, which contain multiple semiconductor dice. For example, systems in a package (SIP) include multiple dice having different configurations, such as a memory, a processing, or an application specific configuration. The multiple dice provide increased integration, security and performance in a component.

One aspect of these multi-dice components is that they typically have a relatively large peripheral outline and thickness. For example, conventional systems in a package have two or more dice spread out on a common substrate. These components are typically larger than conventional plastic semiconductor packages. It would be desirable to be able to fabricate semiconductor components, such as packages and BGA devices, with multiple dice, but also with a chip scale outline and thickness.

At the same time, components need a reliable and efficient internal signal transmission system, and a high input/output capability. One aspect of conventional chip scale components, such as chip scale packages (CSP), is that they are difficult to manufacture with the reliability required in the industry. For example, some chip scale components include relatively complicated signal transmission systems, such as beam leads and wire conductors. These signal transmission systems are difficult to manufacture, and are prone to failure, particularly at the high pin counts required for demanding electronics applications. It would be desirable for a multi-dice component to have a reliable signal transmission system capable of volume manufacture.

The present invention is directed to a multi-dice component having a chip scale outline, an integrated internal signal transmission system, and a high input-output capability. In addition, the present invention is directed to wafer level methods for fabricating multi-dice, chip scale components.

SUMMARY OF THE INVENTION

In accordance with the present invention, multi-dice semiconductor components, wafer level methods for fabricating the components, and systems incorporating the components are provided.

The component includes a base die, and a secondary die stacked on and bonded to the base die. The base die functions as an interconnect and support element for packaging the secondary die, but can also include integrated circuits, such that the component can be configured as a system in a package. The component has a chip scale outline (footprint) substantially identical to that of the base die. In addition, both the base die and the secondary die can be thinned, such that even with stacked dice, the component can have a chip scale thickness (profile).

In an illustrative embodiment, the base die includes a circuit side, a backside, a semiconductor substrate with integrated circuits, and conductive vias in the semiconductor substrate. The secondary die includes a circuit side, a back side, a semiconductor substrate with integrated circuits, and bumped contacts on the circuit side. The bumped contacts on the secondary die are bonded to the base die in electrical communication with the conductive vias. The conductive vias and the bumped contacts form an internal signal transmission system for the component, and allow the circuit side of the secondary die to be bonded to the back side of the base die.

The component also includes an array of terminal contacts on the circuit side of the base die in electrical communication with the conductive vias. In addition, the component includes an underfill layer attaching the base die to the secondary die and can include an encapsulant on the back side of the base die for protecting the secondary die. The component can also include a polymer layer on the circuit side of the base die which functions as a protective layer, a rigidifying member and a stencil for forming the terminal contacts.

An alternate embodiment component includes multiple secondary dice, such as a first secondary die and a second secondary die, stacked and bonded to one another and to a base die. In this embodiment the first secondary die includes conductive vias, and the second secondary die can be bonded to the conductive vias. Another alternate embodiment component includes a base die which functions as an interconnect element with no integrated circuitry. Another alternate embodiment component includes multiple base dice stacked and bonded to one another, and a cap plate bonded to one of the base dice. The cap plate includes conductors that electrically connect selected contacts (e.g., power contacts and ground contacts) on the base dice to one another. As another alternative, the cap plate can include electronic components such as capacitors in a desired circuit pattern.

An illustrative wafer level method for fabricating the component includes the step of providing a secondary wafer containing the secondary dice, and the step of providing a base wafer containing the base dice. The secondary wafer is initially processed to form the bumped contacts, and other elements as well, and the completed secondary dice are singulated from the secondary wafer. Prior to singulation the secondary dice can be tested on the secondary wafer using wafer level test procedures. The secondary dice can also be tested and burned-in following singulation and certified as known good dice (KGD).

The base wafer is initially processed to form the polymer layer, the conductive vias, the bumped contacts, and other elements as well. In addition, the base wafer can be ground, polished or etched to thin the base dice, and facilitate formation of the conductive vias. Further, the base dice on the base wafer can be tested using wafer level test procedures.

Following initial processing and testing of the base wafer, the singulated secondary dice are bonded to the base dice on the base wafer. The bonding step can include formation of an underfill layer on the base wafer, and reflow or conductive adhesive bonding of the bumped contacts on the secondary dice, to the bumped contacts on the base dice. The bonding step can also be performed by bonding the secondary wafer to the base wafer, or by bonding singulated secondary dice to singulated base dice. Following the bonding step, the secondary dice on the base wafer can be thinned by grinding, polishing or etching, and the terminal contacts formed on the base dice. The completed components, each of which includes a base die and a stacked secondary die, are then singulated from the base wafer.

An alternate embodiment wafer level fabrication method includes the steps of processing the base wafer and the secondary wafer, bonding the base wafer to the secondary wafer, and then singulating the components from the bonded wafers. As another alternative fabrication method, the base wafer can be processed and singulated into the base dice, and the singulated secondary dice attached to the singulated base dice.

The component can be used to construct various electrical systems such as module systems, systems in a package (SIPs), computer systems, camcorder systems, camera systems, cellular telephone systems, and medical device systems.

Figure 1A:
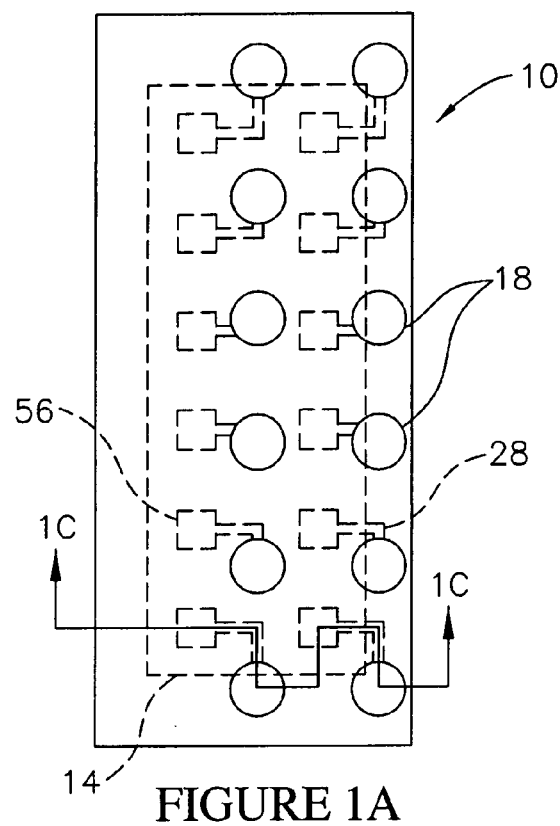
FIG. 1A is an enlarged schematic bottom view of a component constructed in accordance with the invention.

All of the drawing Figures, particularly the cross sectional views, are schematic such that the elements contained therein are not to scale.

DETAILED DESCRIPTION OF THE PREFERRED EMBODIMENTS

As used herein, the term "semiconductor component" refers to an electronic element that includes a semiconductor die. Exemplary semiconductor components include semiconductor packages, semiconductor dice, BGA devices, and DDC devices.

The term "wafer level fabrication method" means a semiconductor fabrication method in which semiconductor wafers are used to make semiconductor components.

Figure 1B:
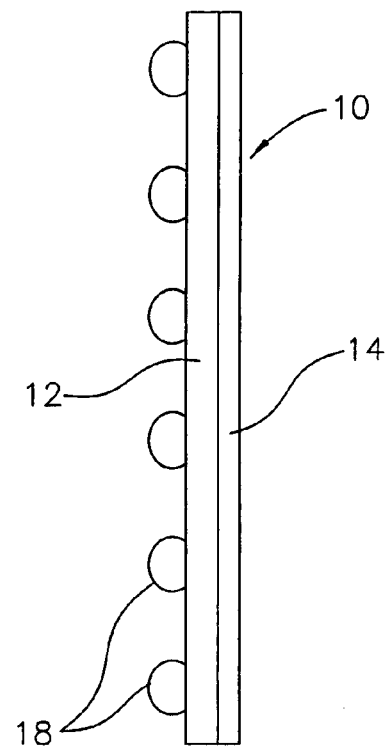
FIG. 1B is a enlarged schematic side elevation view of the component.
Figure 1C:
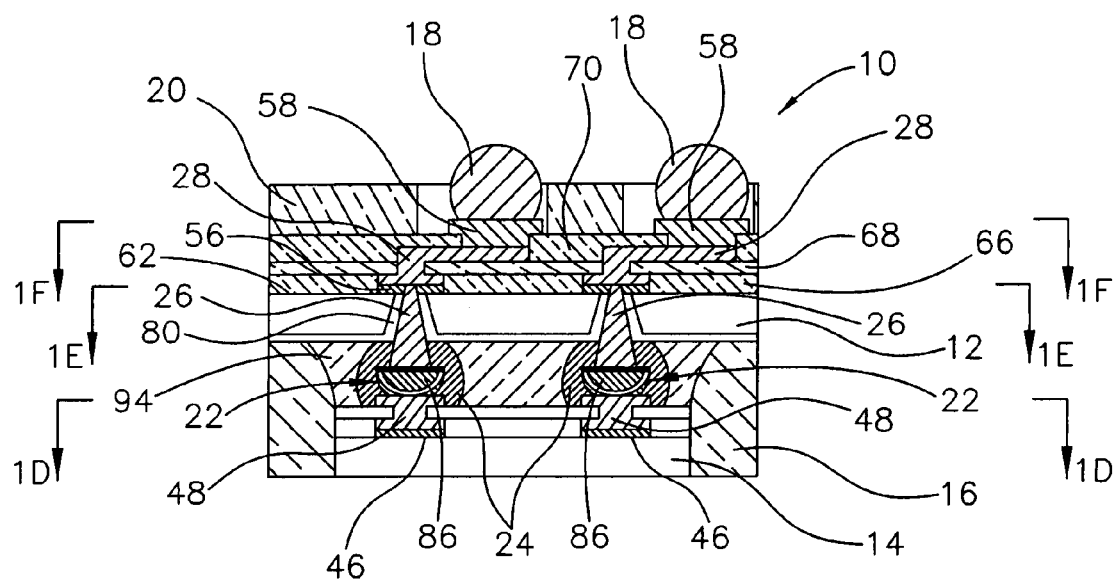
FIG. 1C is an enlarged schematic cross sectional view of the component taken along section line 1C-1C of FIG. 1A.

Referring to FIGS. 1A-1F, a component 10 constructed in accordance with the invention is illustrated. As shown in FIG. 1C, the component 10 includes a base die 12 (first die in the claims), and a secondary die 14 (second die in the claims). As will be further explained, the base die 12 and the secondary die 14 are stacked and bonded to one another.

In the embodiment illustrated in FIGS. 1A-1F, the base die 12 and the secondary die 14 comprise active semiconductor dice having a desired electrical configuration. For example, each die 12, 14 can comprise a high speed digital logic device, such as a dynamic random access memory (DRAM), a static random access memory (SRAM), a flash memory, a microprocessor, a digital signal processor (DSP), or an application specific integrated circuit (ASIC). In addition, each die 12, 14 can have a different configuration. For example, the base die 12 can comprise an application specific device, and the secondary die 14 can comprise a memory device, such that the component 10 can be configured as a system in a package (SIP).

Alternately the base die 12, rather than being an active semiconductor dice, can comprise an interconnect element with no integrated circuitry. For example, component 10E in FIG. 4E includes a base die 12E with no integrated circuitry, and component 10F in FIG. 4F includes a base die 12F with no integrated circuitry.

As shown in FIGS. 1A-1C, the component 10 also includes an array of electrically conductive terminal contacts 18 configured for signal transmission to and from the component 10. The terminal contacts 18 are also sometimes referred to in the art as outer lead bonds (OLB). In the illustrative embodiment, the terminal contacts 18 comprise metal bumps or balls. However, the terminal contacts 18 can also comprise pins, polymer bumps, spring contacts or any terminal contact or outer lead bond (OLB) known in the art. Also in the illustrative embodiment, there are twelve terminal contacts 18, arranged in a ball grid array (BGA) which includes two rows of six terminal contacts 18 each. However, this arrangement is merely exemplary, and the terminal contacts 18 can be arranged in any area array, such as a fine ball grid array (FBGA), an edge array or a peripheral array, containing any desired number of terminal contacts 18.

Further, the terminal contacts 18 have outside diameters on the order of about 300 µm to 350 µm. This makes the terminal contacts 18 much larger in comparison to the other elements of the component 10. However, for illustrative purposes the terminal contacts 18 are shown as being about the same size as other elements of the component 10.

The component 10 also includes an encapsulant 16 formed on the base die 12 and on the edges of the secondary die 14. The encapsulant 16 can comprise a polymer material such as an epoxy, a silicone, a polyimide or a transfer molded underfill compound (MUF). In addition, these polymer materials can include fillers such as silicates configured to reduce the coefficient of thermal expansion (CTE) and adjust the viscosity of the polymer material. The encapsulant 16 can alternately comprise a laser imageable material, which can be patterned using a stereographic lithography process to be hereinafter described. As another alternative, the encapsulant 16 can be eliminated. For example, component 10G in FIG. 4G includes an underfill layer 94G which performs the function of the encapsulant 16.

As shown in FIG. 1C, the component 10 also includes a polymer layer 20 formed on a circuit side 62 of the base die 12 proximate to the terminal contacts 18. The polymer layer 20 can comprise a polymer material such as an epoxy, a silicone, a polyimide, a photoimageable material such as a resist, or a laser imageable material. Such a polymer layer 20 is sometimes referred to as a front side polymer (FSP). As will be further explained, in addition to performing a protective function, the polymer layer 20 performs a rigidifying function for the component 10. In addition, the polymer layer 20 can be configured as a polymer stencil for forming the terminal contacts 18. However, the polymer layer 20 can also be eliminated. For example, a component 10C in FIG. 4C has no polymer layer 20.

As shown in FIG. 1C, the component 10 also includes a plurality of interconnect contacts 22, which function as internal signal transmission elements for transmitting signals between the base die 12 and the secondary die 14. Each interconnect contact 22 includes a bumped contact 24 on the secondary die 14 in electrical communication with a conductive via 26 on the base die 12. Each interconnect contact 22 also includes a bumped contact 86 on the base die 12 bonded to a conductive via 26 and to a bumped contact 24 on the secondary die 14. The bumped contacts 24 and the bumped contacts 86 are also referred to herein as inner lead bonds (ILB). In addition, the bumped contacts 24 can have an outside diameter of only about 60 µm to 100 µm. This makes the bumped contacts 24 several times smaller than the terminal contacts 18, which are about 300 µm to 350 µm in diameter. However, for illustrative purposes the bumped contacts 24 and the terminal contacts 18 are shown as being about the same size.

Figure 1D:
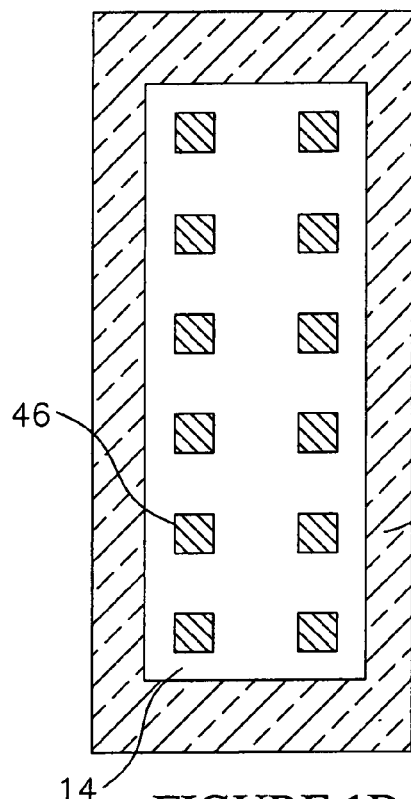
FIG. 1D is an enlarged schematic cross sectional view of the component taken along section line 1D-1D of FIG. 1C.

As shown in FIG. 1D, the secondary die 14 includes a plurality of die contacts 46, such as interlevel bond pads, device bond pads, or redistribution pads, in electrical communication with the integrated circuits 32 (FIG. 2A) contained on the secondary die 14. As will be further explained, the bumped contacts 24 are formed on the die contacts 46, and the bumped contacts 24 are bonded to the conductive vias 26. In the illustrative embodiment there are twelve die contacts 46 formed as an area array of two rows of six die contacts 46, with each row located proximate to a peripheral edge of the secondary die 14. However, this arrangement is merely exemplary and the die contacts 46 can be formed in any desired pattern. For example in a component 10D shown in FIG. 4D a secondary die 14D includes die contacts 46 formed along a center line of the die 14D (center connect).

Figure 1E:
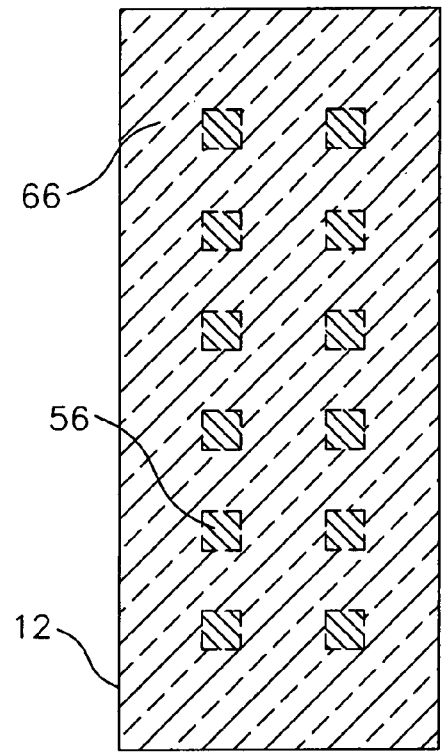
FIG. 1E is an enlarged schematic cross sectional view of the component taken along section line 1E-1E of FIG. 1C.

As shown in FIG. 1E, the base die 12 includes a plurality of die contacts 56, such as interlevel bond pads, device bond pads, or redistribution pads, in electrical communication with the integrated circuits 60 (FIG. 3A) contained on the base die 12. In the illustrative embodiment the pattern of the die contacts 56 on the base die 12 matches the pattern of the die contacts 46 on the secondary die 14.

Figure 1F:
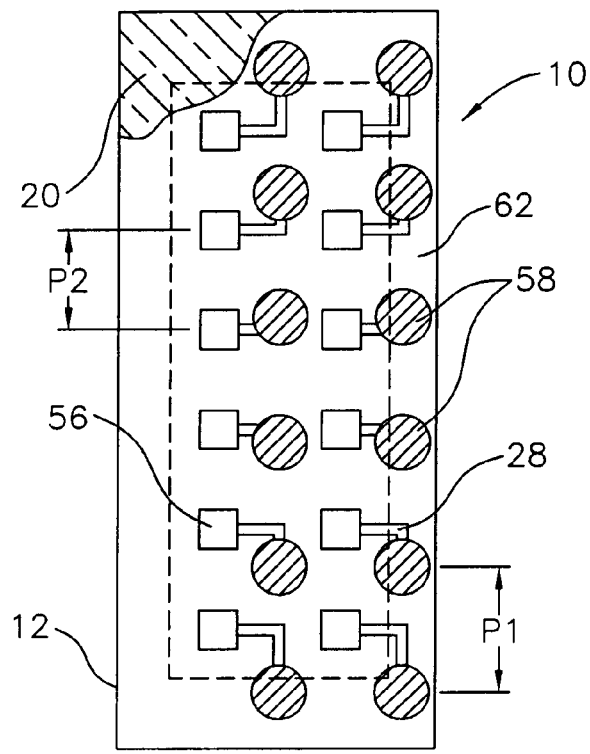
FIG. 1F is an enlarged schematic cross sectional view of the component taken along section line IF-IF of FIG. 1C.

As shown in FIG. 1F, the component 10 also includes a pattern of redistribution conductors 28 on the circuit side 62 of the base die 12 in electrical communication with the conductive vias 26 (FIG. 1C), and with under bump metallization layers 58 for the terminal contacts 18 (FIG. 1C). The redistribution conductors 28 allow the pitch P1 of the terminal contacts 18 to be different than the pitch P2 of the die contacts 56. For example, the redistribution conductors 28 can have a "fan out" configuration, such that the pitch P1 of the terminal contacts 18 can be greater than the pitch P2 of the die contacts 56. Alternately, the pitch PI of the terminal contacts 18 can be equal to, or less than, the pitch P2 of the die contacts 56. In this application, the redistribution conductors 28 change a standard pattern of the die contacts 56 to a customized pattern of the terminal contacts 18. However, as will be further explained, the redistribution conductors 28 can be eliminated, and the terminal contacts 18 can be formed directly on the die contacts 56. For example a component 10C in FIG. 4C does not have redistribution conductors 28 and the terminal contacts 18 are formed directly on the die contacts 56 on the base die 12.

As shown in FIG. 1C, the component 10 also includes an underfill layer 94 which bonds the secondary die 14 to the base die 12. The underfill layer 94 can comprise a curable material or a tape material. In addition, the underfill layer 94 can also perform the function of the encapsulant. For example, a component 10G in FIG. 4G includes an underfill layer 94G which also functions as an encapsulant.

Additional elements of the component 10 shown in FIGS. 1A-1E, will be identified as the description proceeds.

Figure 2:
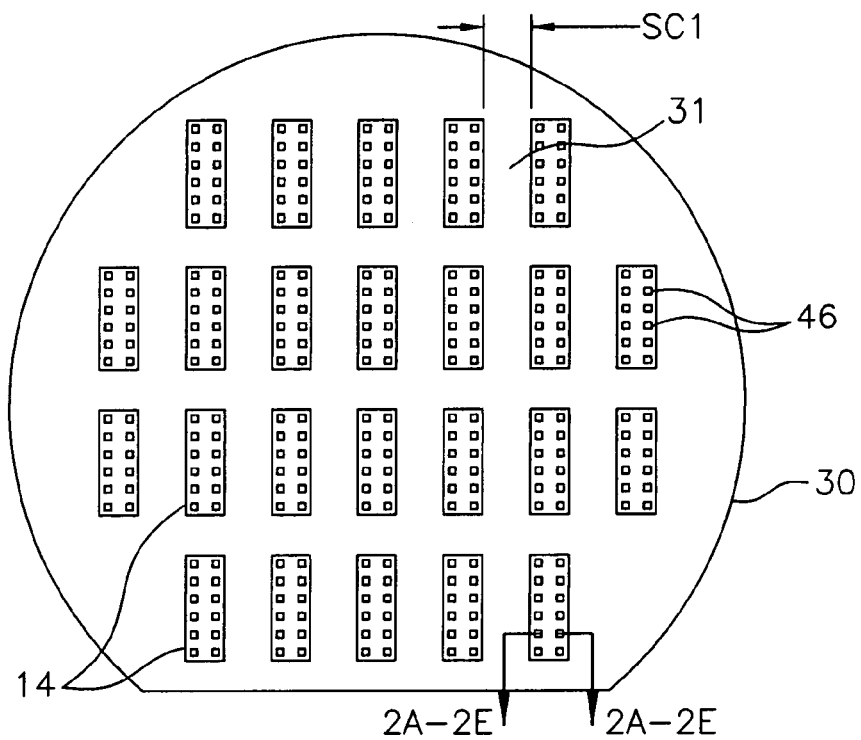
FIG. 2 is a plan view of a secondary wafer used in the fabrication of the component.
Figure 3:
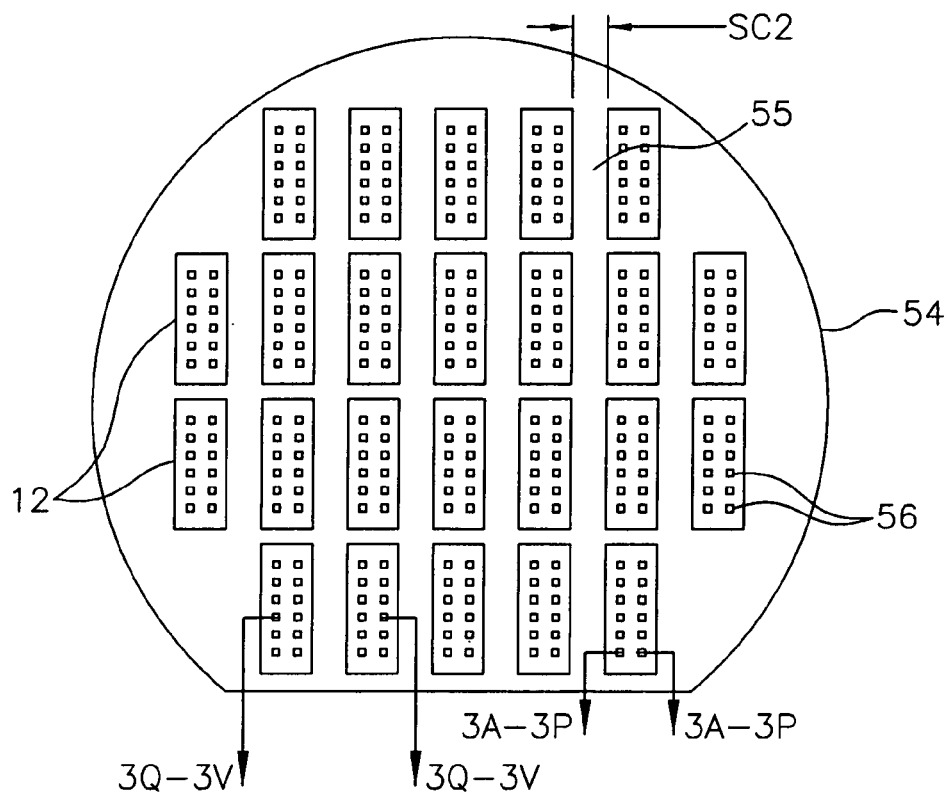
FIG. 3 is a plan view of a base wafer used in the fabrication of the component.

Referring to FIGS. 2 and 3, initial steps in a method for fabricating the component 10 are illustrated. Initially, as shown in FIG. 2, a secondary wafer 30 containing a plurality of secondary dice 14 is provided. In addition, as shown in FIG. 3, a base wafer 54 containing a plurality of base dice 12 is provided.

Figure 2A:
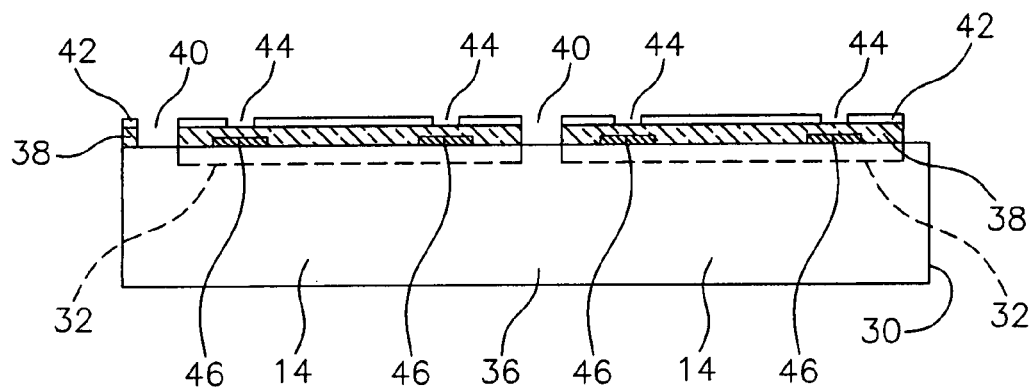
FIGS. 2A-2E are schematic cross sectional views taken along section line (2A-2E)-(2A-2E) of FIG. 2 illustrating steps performed on dice on the secondary wafer during fabrication of the component.

Referring to FIGS. 2A-2E, fabrication steps performed on the secondary wafer 30 are illustrated. As shown in FIG. 2A, each secondary die 14 includes a plurality of integrated circuits 32 formed on a circuit side 34 thereof in a desired electrical configuration. The integrated circuits 32 are formed in a silicon substrate 36 of the secondary wafer 30 using techniques that are well known in the art. Alternately, the silicon substrate 36 can comprise another semiconductor material such as gallium arsenide.

As also shown in FIG. 2A, the secondary wafer 30 also includes an electrically insulating passivation layer 38, such as a polymer, such as polyimide or BCB, an oxide such as silicon dioxide, or a glass, such as borophosphosilicate glass (BPSG). The passivation layer 38 can be formed using techniques that are known in the art, such as by blanket deposition onto the secondary wafer 30 to a desired thickness. In addition, the passivation layer 38 can include trenches 40 aligned with the streets between the secondary dice 14.

As also shown in FIG. 2A, a mask layer 42 is formed on the passivation layer 38. The mask layer 42 can comprise an electrically insulating polymer material, such as polyimide, photoimageable polyimide, BCB, epoxy or a resist formed with a pattern of openings 44. The mask layer 42 initially functions as a mask for etching the passivation layer 38, and then as a permanent electrically insulating layer in the completed component 10. The openings 44 align with the die contacts 46 on the circuit side 34 of the secondary dice 14. Following the etching step using the mask layer 42, the openings 44 extend through the passivation layer 38 to the die contacts 46.

At this point the secondary dice 14 on the secondary wafer 30 can be probe tested using probes placed in the openings 44 in electrical communication with the die contacts 46. The probe testing can be performed using standard techniques and used to identify those secondary dice 14 on the secondary wafer 30 that are "good die".

Figure 2B:
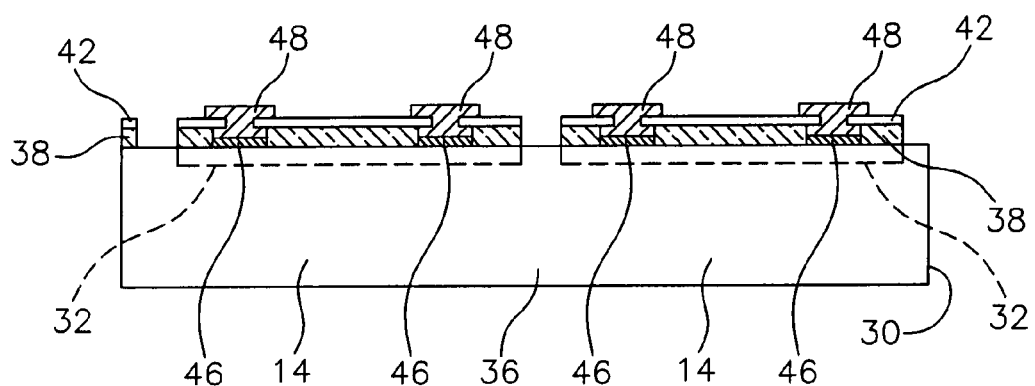

Next, as shown in FIG. 2B, the under bump metallization (UBM) layers 48 are formed in the openings 44 and on the die contacts 46. The UBM layers 48 can comprise one or more layers configured to provide surfaces for forming or bonding the bumped contacts 24. In the illustrative embodiment, each UBM layer includes an adhesion metal layer formed of a metal such as nickel, zinc, chromium, or palladium and a solder wettable metal layer formed of a metal such as palladium or gold. The UBM layers 48 can be formed using a suitable deposition process such as electroless plating, electrolytic plating or chemical vapor deposition (CVD).

Figure 2C:
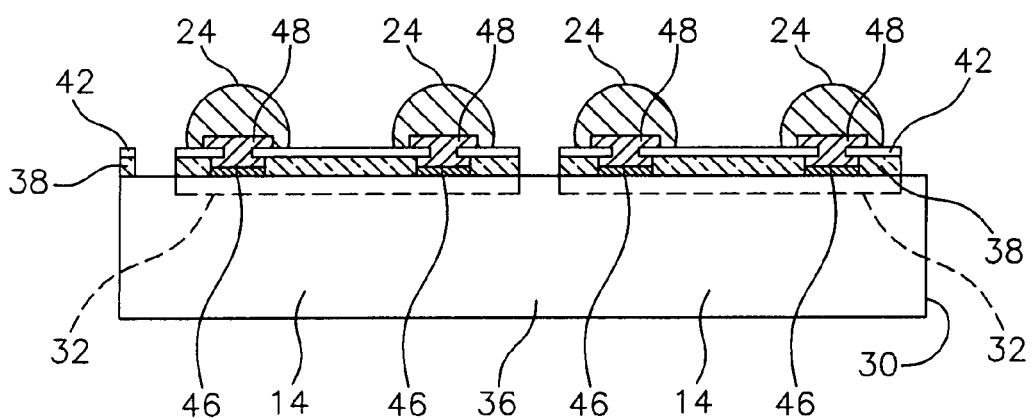

Next, as shown in FIG. 2C, the bumped contacts 24 are formed on the UBM layers 48. The bumped contacts 24 can comprise a metal such as solder, deposited using a suitable process such as dipping, wave soldering, stenciling, or screen printing. One suitable process for forming the bumped contacts 24 is described in U.S. Pat. No. 6,372,624 B1 to Farnworth et al., entitled "Method For Fabricating Solder Bumps By Wave Soldering", which is incorporated herein by reference. The bumped contacts 24 can also be formed using a bonding process such as ball bumping with a ball bumper apparatus or a wire bonder.

As another alternative, the bumped contacts 24 can comprise a conductive polymer formed using a suitable process such as stenciling or screen printing. As yet another alternative, the bumped contacts 24 can comprise metal or metal plated pins formed on, or bonded to, the UBM layers 48. In some of the description to follow, the bumped contacts 24 are referred to as inner lead bonds (ILB). As yet another alternative, the bumped contacts 24 can be eliminated and the UBM layers 48 can be bonded directly to bumped contacts 86 (FIG. 1C) on the base die 12.

Figure 2D:
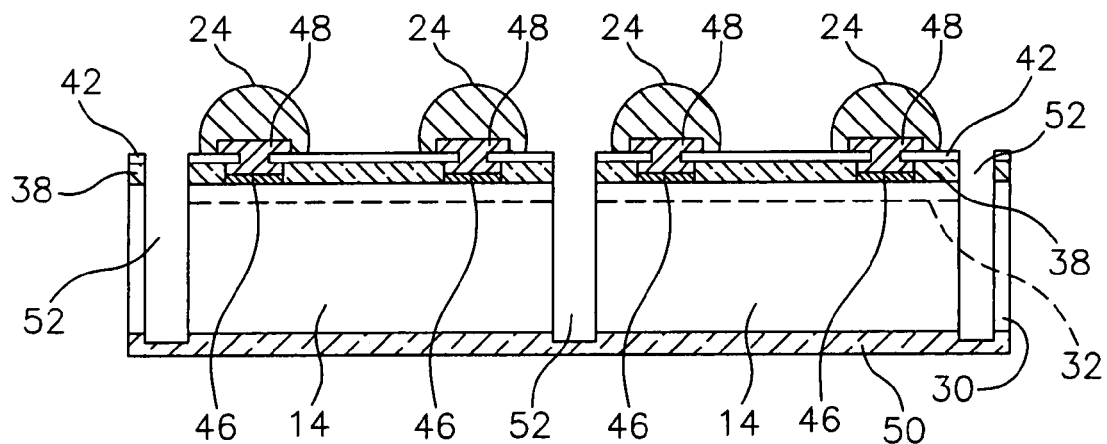

Next, as shown in FIG. 2D, a singulating step is performed to singulate or separate the secondary dice 14 from the secondary wafer 30. One method for performing the singulating step is to attach the secondary wafer 30 to a dicing tape 50, and then cut kerfs 52 through the streets 31 (FIG. 2) of the secondary wafer 30 using a dicing saw. The singulating step also controls the width of the secondary dice 14. In FIG. 2, the singulating step is illustrated as being performed to form the kerfs 52 (FIG. 2D) with a saw blade having a selected width SC1 (saw cut 1). As will be further explained, this width SC1 can be greater than the width of a saw blade SC2 (FIG. 3) used to singulate a base wafer 54 (FIG. 3). The width of the secondary dice 14 (FIG. 2) will thus be less than the width of the base dice 12 by an amount equal to the difference between the width SC1 (FIG. 2) and the width SC2 (FIG. 3).

Alternately rather than sawing, the singulating step can be performed using another singulation method, such as cutting with a laser or a water jet, or be etching the secondary wafer 30 with a suitable wet or dry etchant. As will be further explained, following the singulating step, the secondary dice 14 will be removed from the dicing tape 50 using a pick and place mechanism or other suitable apparatus and placed on the base wafer 54 (FIG. 3).

However, prior to the singulating step, the integrated circuits 32 on the secondary dice 14 can be evaluated by wafer level testing of the secondary wafer 30 using equipment and techniques that are known in the art. For example, the secondary wafer 30 can be placed in a wafer prober having a probe card with probe contacts configured to electrically engage either the die contacts 46 or the bumped contacts 24. The testing can include functionality and parametric tests that are known in the art. The secondary dice 14 can thus be evaluated and mapped prior to the singulating step. As another optional alternative, the singulated secondary dice 14 can be further tested and burned-in, and certified as known good dice (KGD).

Figure 2E:
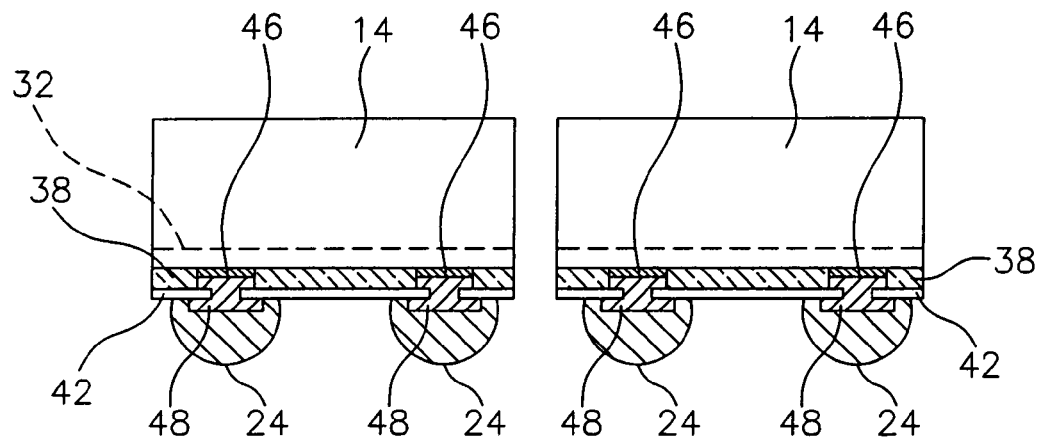

As shown in FIG. 2E, each singulated secondary die 14 includes the passivation layer 38, the mask layer 42 and the bumped contacts 24 formed on the UBM layers 48 in electrical communication with the integrated circuits 32.

Figure 3A:
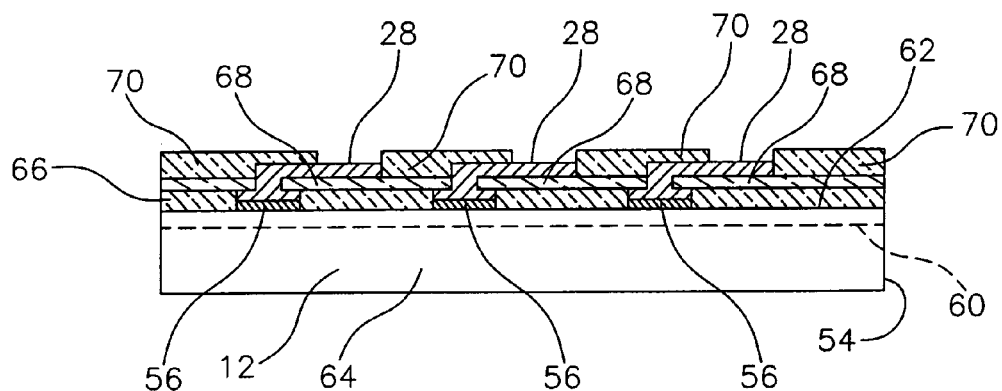
FIGS. 3A-3P are schematic cross sectional views taken along section line (3A-3P)-(3A-3P) of FIG. 3 illustrating steps performed on a die on the base wafer during fabrication of the component with three different embodiments (I, II, III) illustrated in FIGS. 3M-3P.
Figure 3B:
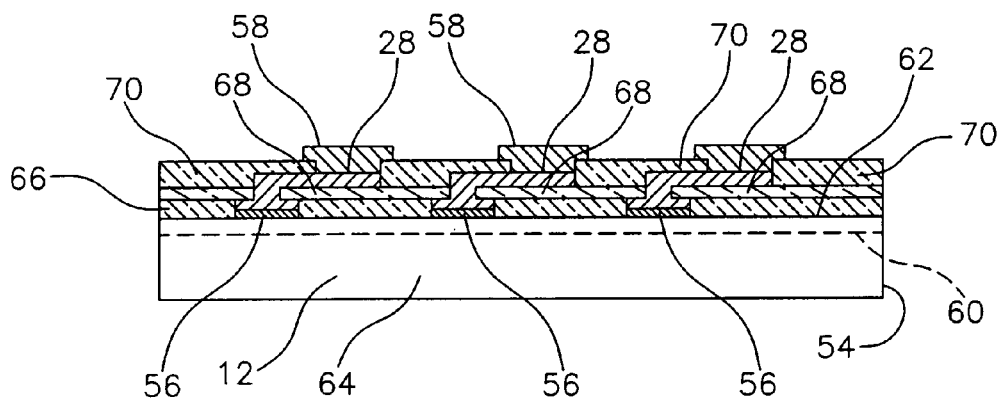
FIGS. 3Q-3V are schematic cross sectional views taken along section line (3A-3P)-(3A-3P) of FIG. 3 illustrating steps performed on dice on the base wafer during fabrication of the component using embodiment II in FIGS. 3M-3P.
Figure 3C:
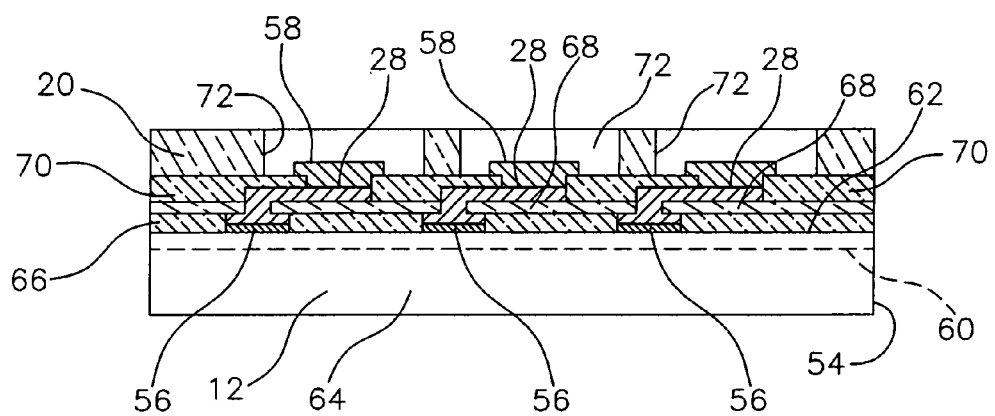
Figure 3D:
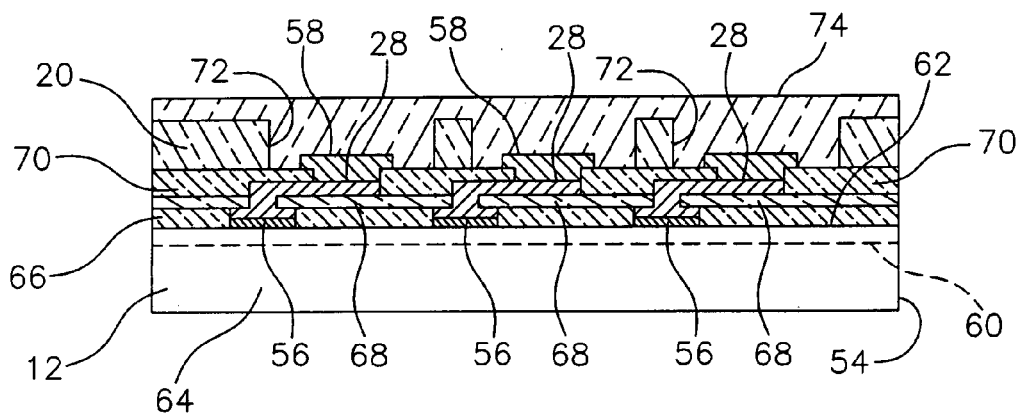
Figure 3E:
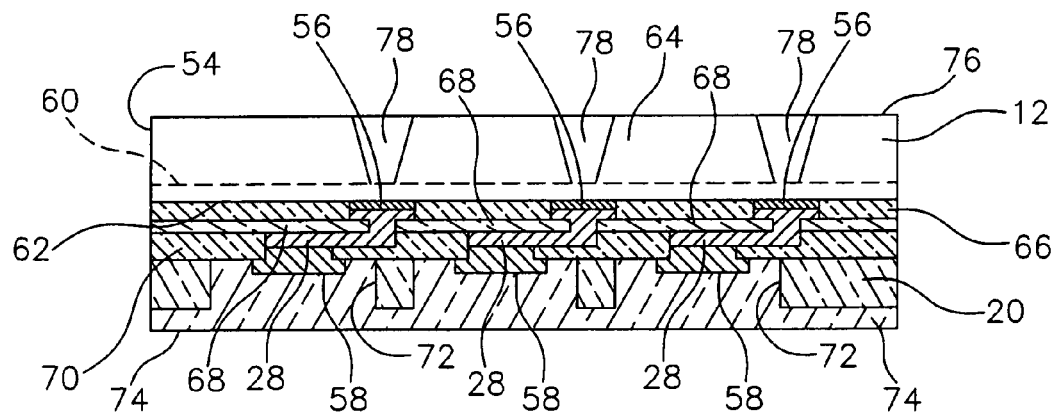
Figure 3F:
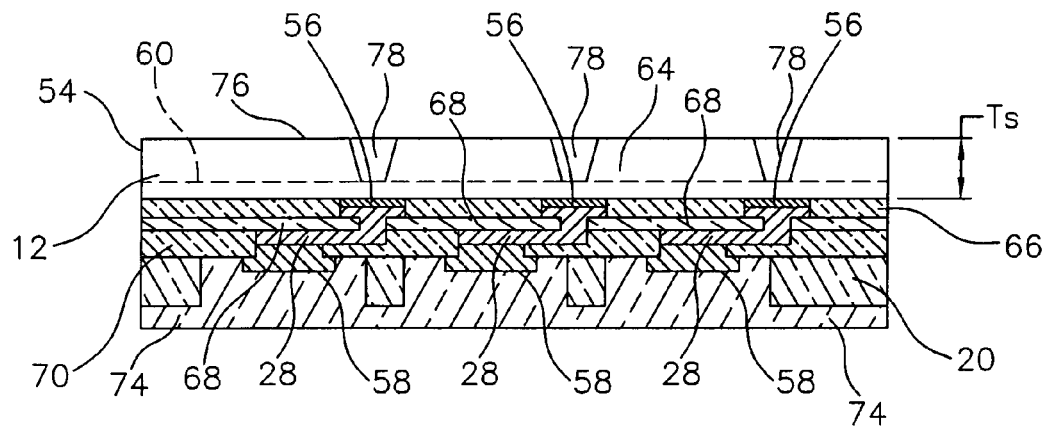
Figure 3G:
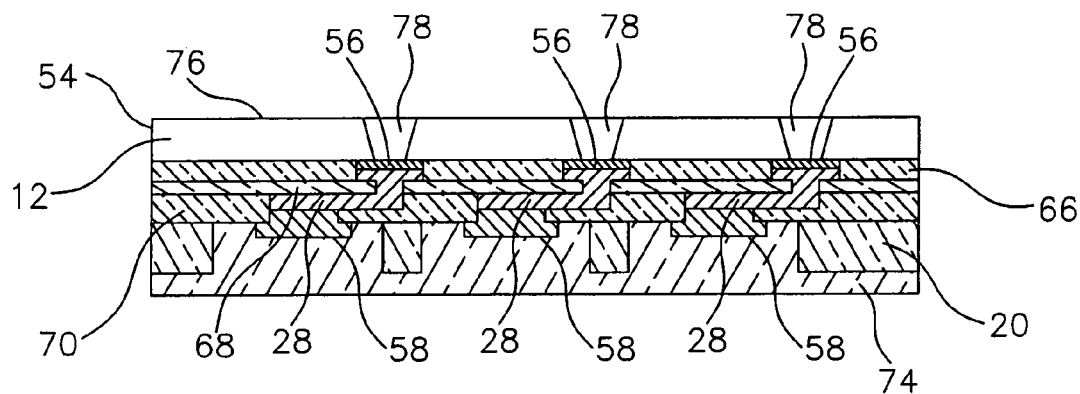
Figure 3H:
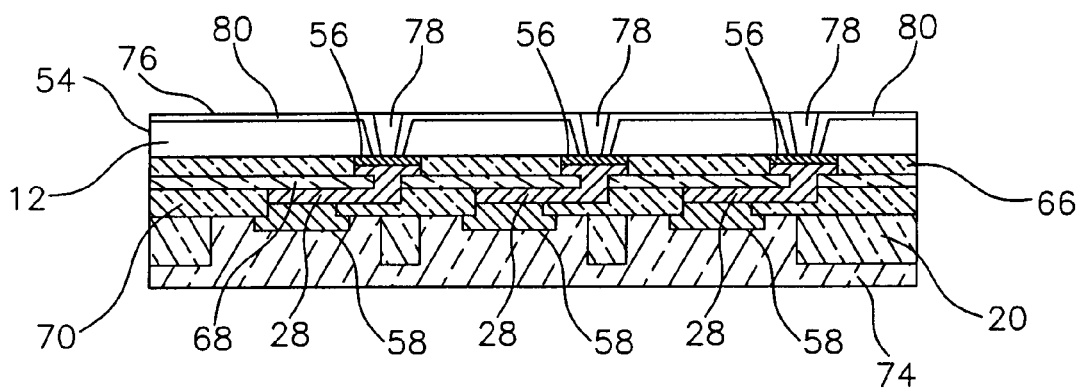
Figure 3I:
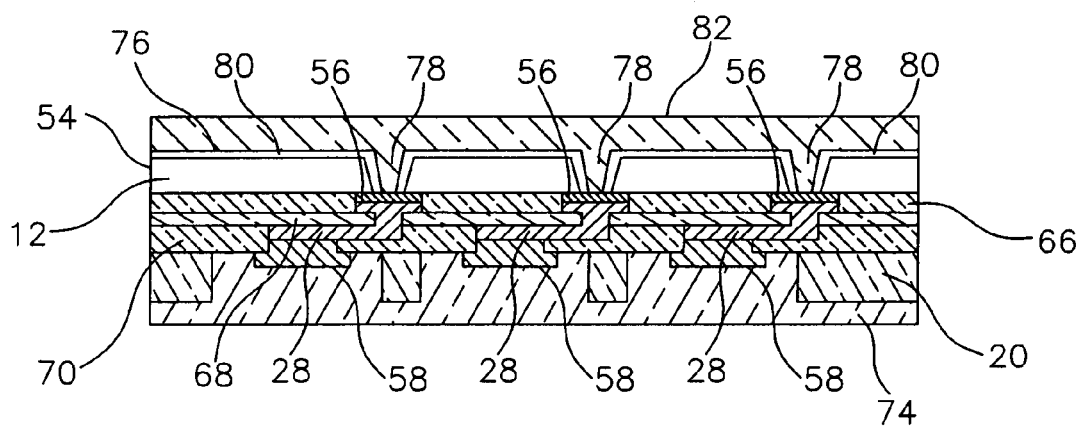
Figure 3J:
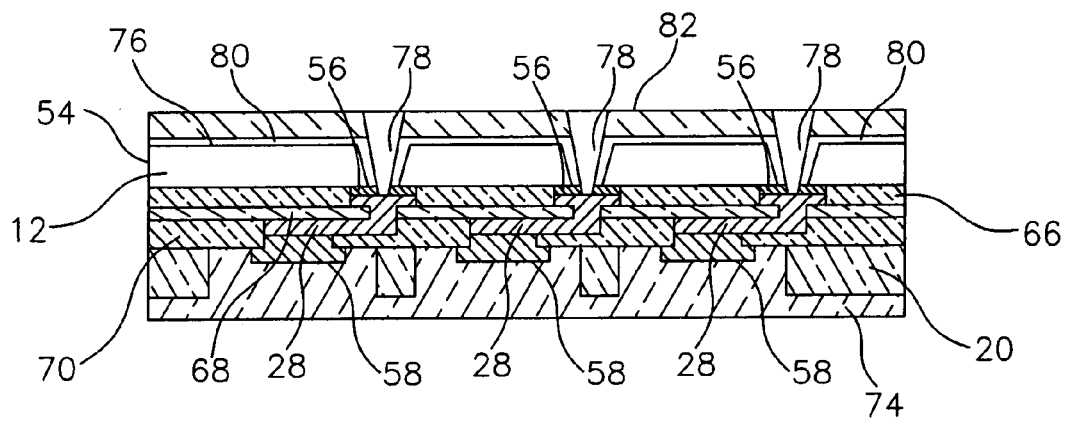
Figure 3K:
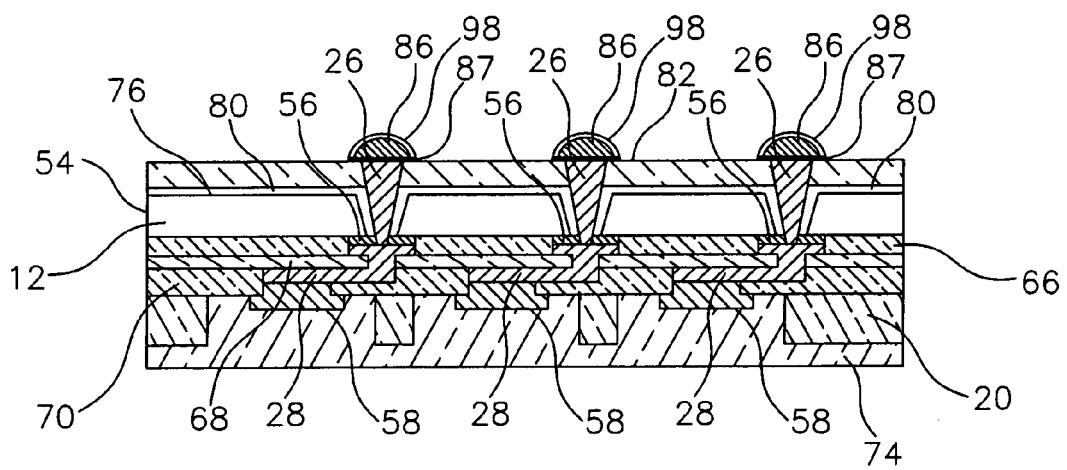
Figure 3L:
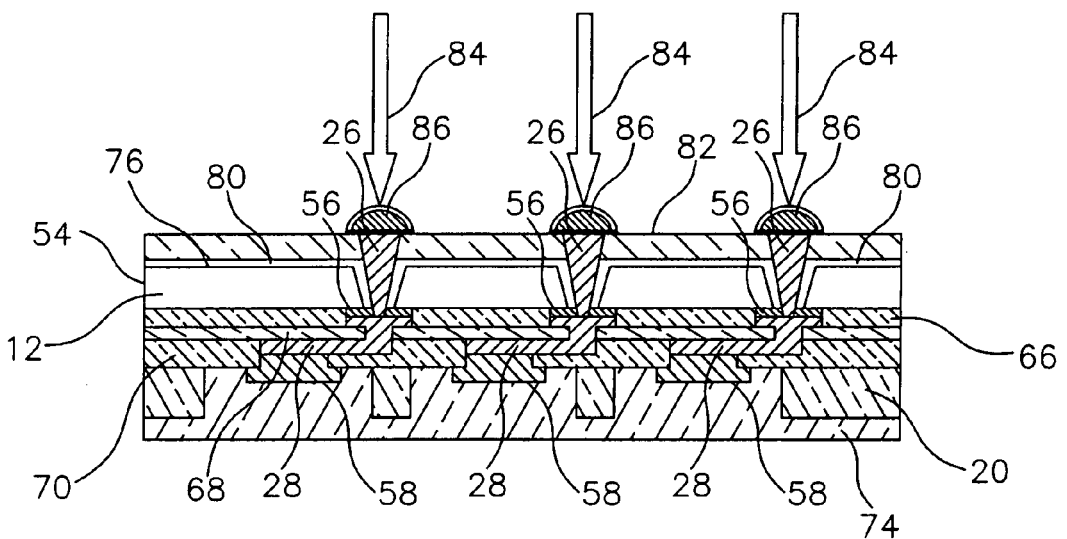
Figure 3M:
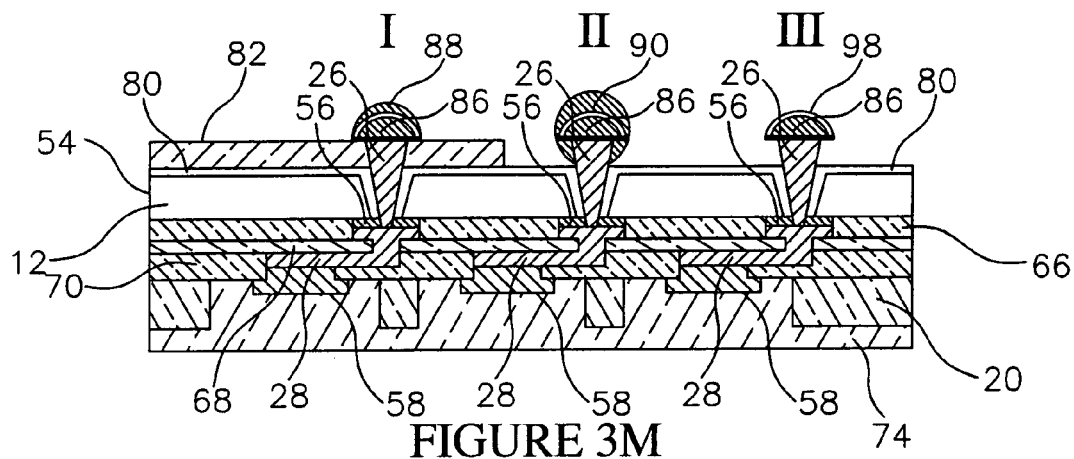
Figure 3N:
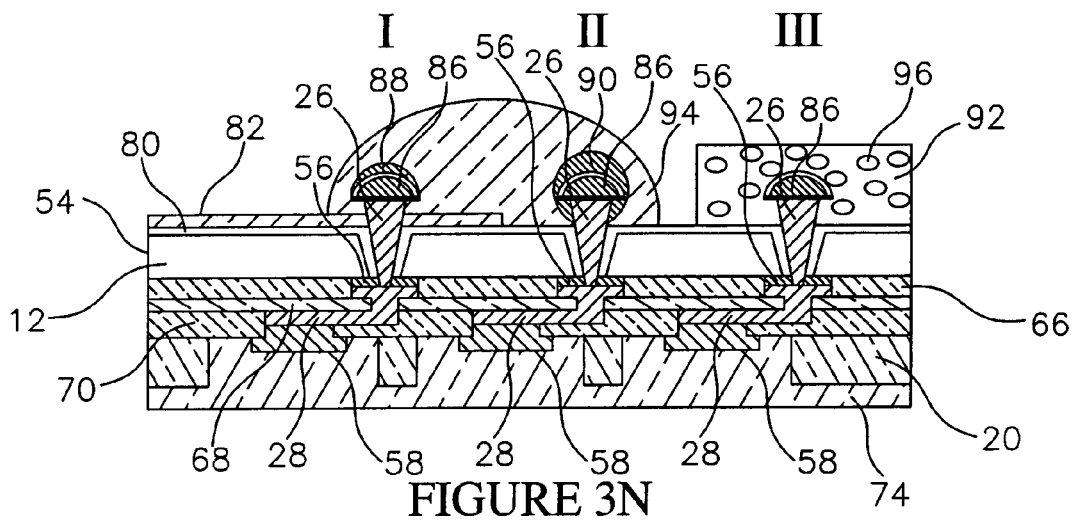
Figure 3O:
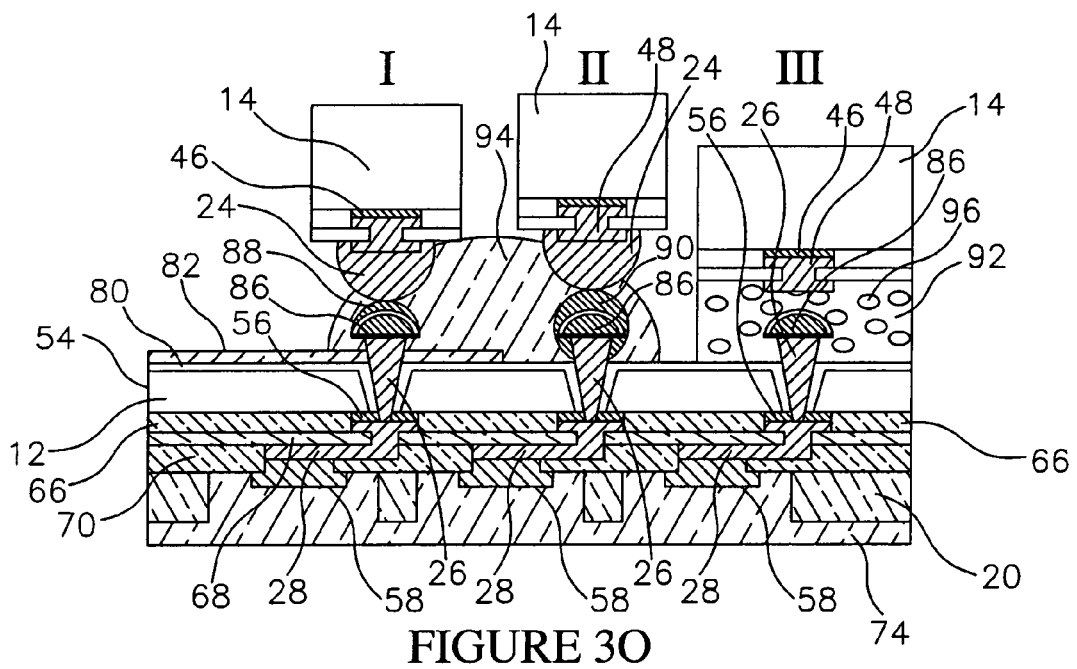
Figure 3P:
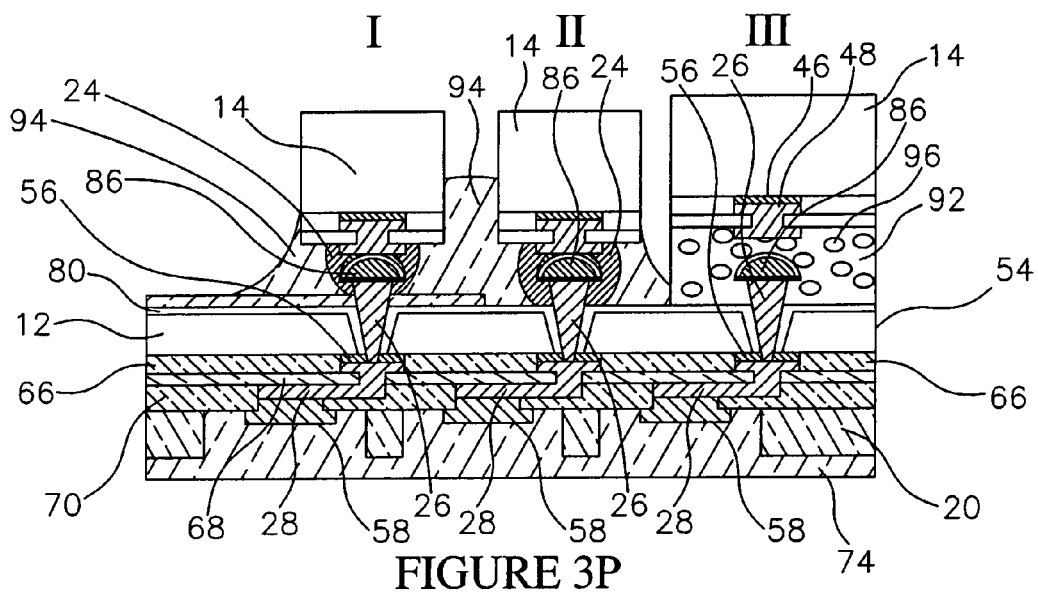
Figure 3Q:
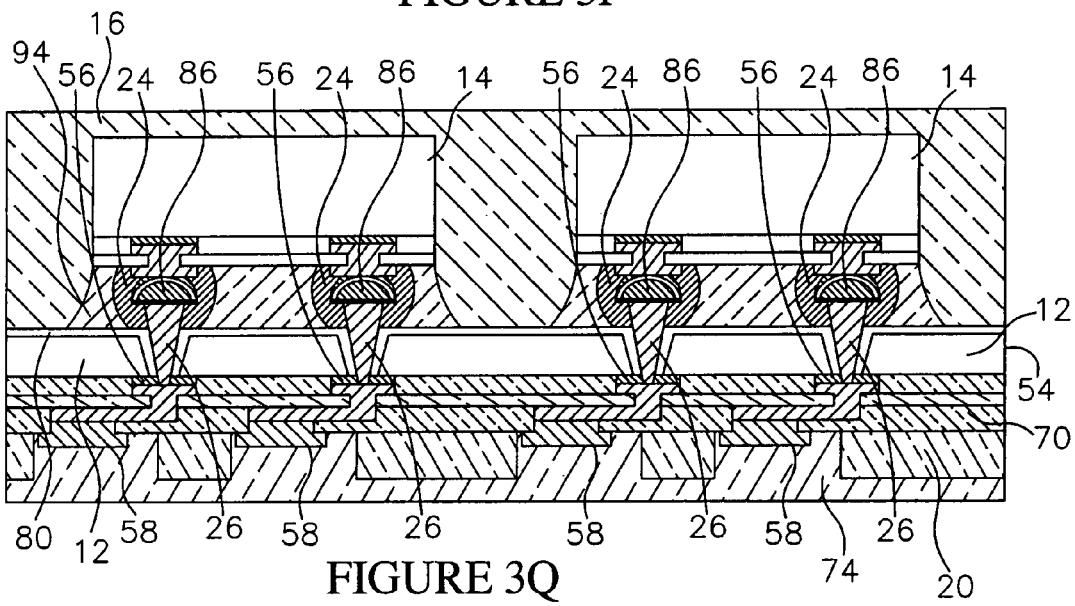
Figure 3R:
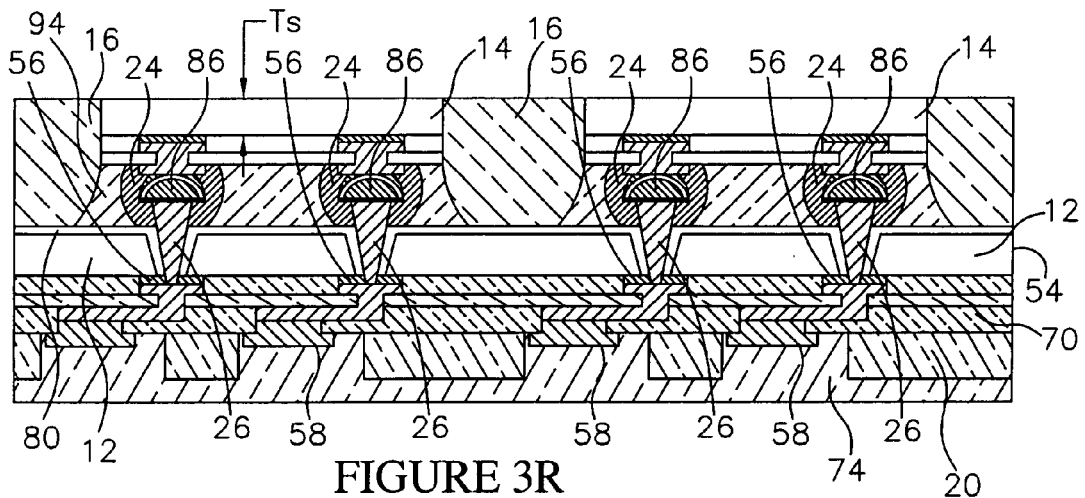
Figure 3S:
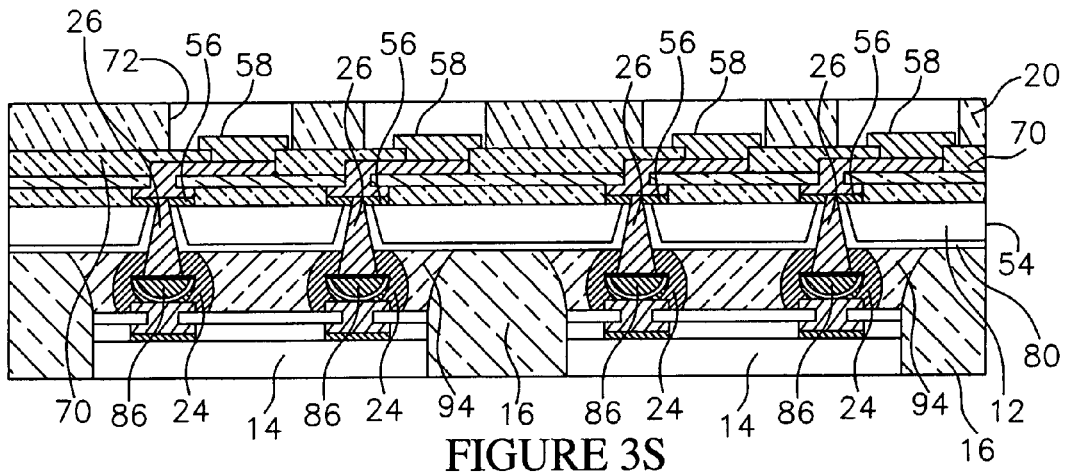
Figure 3T:
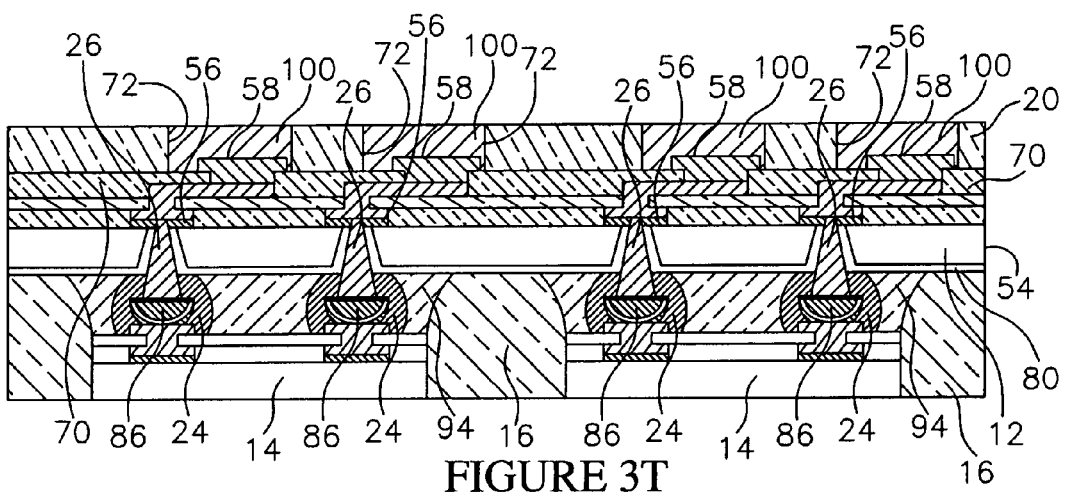
Figure 3U:
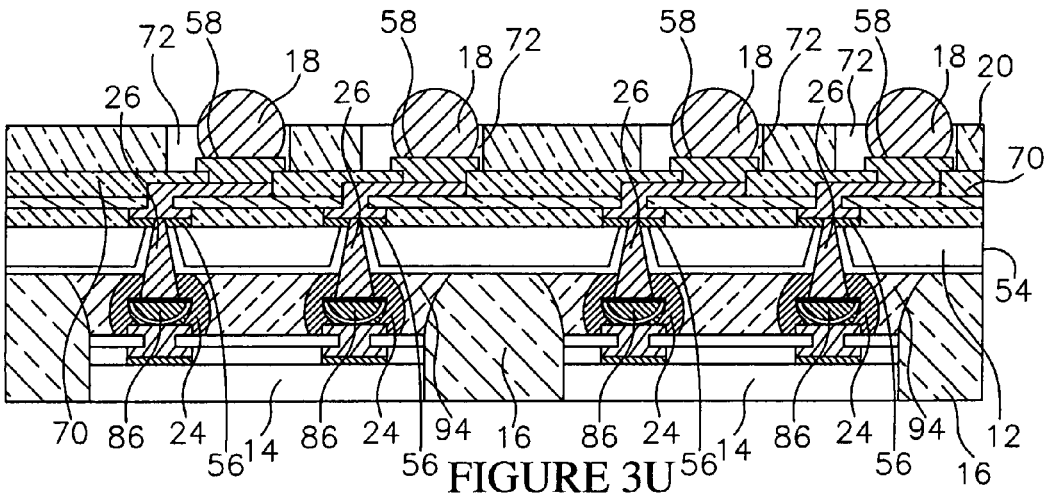
Figure 3V:
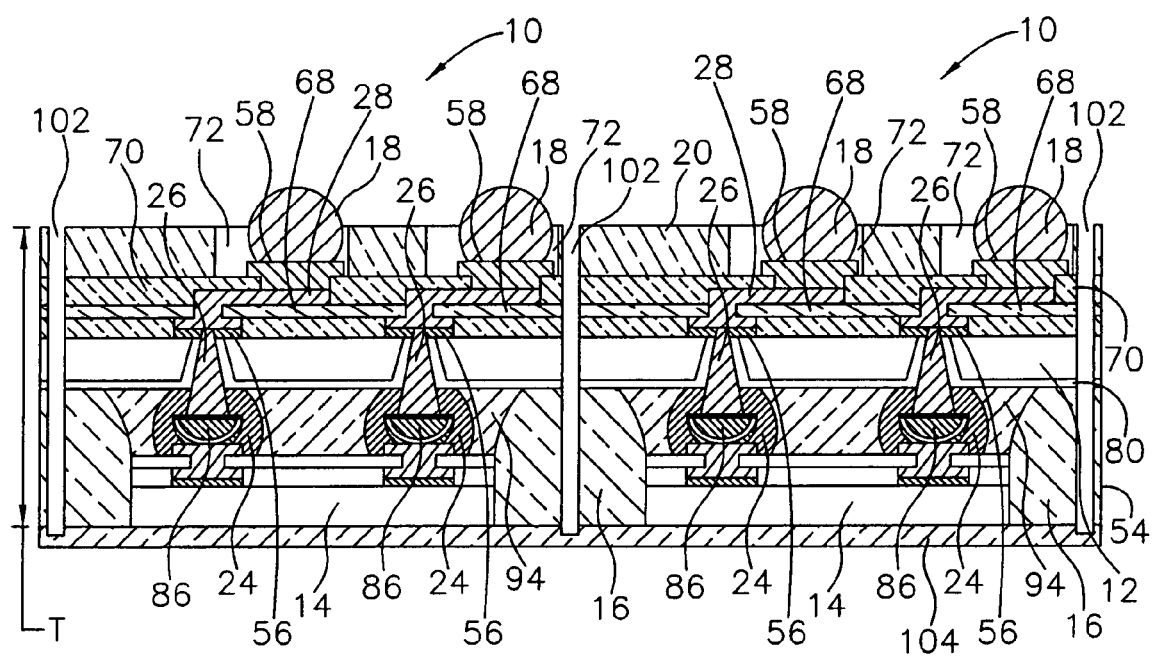

Referring to FIGS. 3A-3V, fabrication steps performed on the base wafer 54 are illustrated. As shown in FIG. 3A, each base die 12 includes a plurality of integrated circuits 60 formed on a circuit side 62 thereof in a desired electrical configuration. The integrated circuits 60 are formed in a silicon substrate 64 of the base wafer 54 using techniques that are well known in the art. Alternately, the silicon substrate 64 can comprise another semiconductor material such as gallium arsenide. Each base die 12 also includes the die contacts 56 in electrical communication with the integrated circuits 60. As another alternative, the base wafer 54 can be provided with no integrated circuits such that the base die 12 functions as an interconnect element but not as a active semiconductor device. For this reason the base wafer 54 is sometimes referred to in the description to follow as a through wafer interconnect (TWI).

As shown in FIG. 3A, the base wafer 54 also includes an electrically insulating passivation layer 66, such as a polymer, such as polyimide or BCB, an oxide such as silicon dioxide, or a glass, such as borophosphosilicate glass (BPSG). The passivation layer 66 can be formed using techniques that are known in the art, such as by blanket deposition onto the base wafer 54 to a desired thickness.

Initially, as shown in FIG. 3A, the redistribution conductors 28 are formed in electrical communication with the die contacts 56. The redistribution conductors 28 can be formed using a subtractive process (e.g., etching) or an additive process (e.g., sputtering, or a combination of sputtering and plating) as is known in the art. Redistribution conductors are widely used in semiconductor manufacture to customize the signal transmitting and terminal contact configuration of dice having standardized bond pad configurations. One suitable redistribution process is described in U.S. Pat. No. 5,851,911 to Farnworth, which is incorporated herein by reference. Alternately the redistribution conductors 28 can be eliminated if the die contacts 56 have the required configuration. For example, the die contacts 56 can be made to accommodate the same pattern as the terminal contacts 18 (FIG. 1C). In this case the redistribution conductors 28 can be eliminated.

In addition to the redistribution conductors 28, a first redistribution insulating layer 68 is formed between the redistribution conductors 28 and the passivation layer 66, and a second redistribution insulating layer 70 is formed on the redistribution conductors 28. The first redistribution insulating layer 68 and the second redistribution insulating layer 70 can comprise a polymer, such as polyimide or PBO (polybenzoxazole), deposited to a desired thickness using a suitable deposition process. If the redistribution conductors 28 are not formed, then the redistribution insulating layers 68, 70 can be eliminated.

Next, as shown in FIG. 3B, the under bump metallization layers 58 for the terminal contacts 18 are formed on the redistribution conductors 28. The under bump metallization layers 58 can comprise adhesion metal layers and solder wettable metal layers, formed substantially as previously described for under bump metallization layers 48 (FIG. 2B). In the illustrative embodiment the under bump metallization layers 58 have the pattern shown in FIG. 1F.

Next, as shown in FIG. 3C, the polymer layer 20 can be formed on the second redistribution insulating layer 70. The polymer layer 20, in addition to protecting the back side of the completed component 10, also functions as a stiffener and rigidifying member as the base die 12 will subsequently be thinned. In addition, the polymer layer 20 can be used as a stencil for forming the terminal contacts 18. A representative thickness for the polymer layer 20 can be from 25 μm to 150 μm. However, the polymer layer 20 is optional and can be omitted for some applications.

The polymer layer 20 can comprise a polymer patterned with openings 72 aligned with the under bump metallization layers 58. One method for forming the polymer layer 20 is with a stereo lithographic process. With stereo lithography, the polymer layer 20 can comprise a laser imageable material, such as a "Cibatool SL 5530" resin manufactured by Ciba Specialty Chemicals Corporation, or an "SI40" laser imageable material manufactured by RPC Corporation. To perform the stereo lithographic process, a layer of the laser imageable material can be blanket deposited on the base wafer 54 in viscous form using a suitable process such as spin on, and then exposed using a laser beam to define the openings 72.

The layer can then be developed to form the openings 72 in the exposed areas. The layer can then be rinsed, cleaned with a cleaning agent such as alcohol, and spun to remove excess material. The base wafer 54 can then be placed in an oven, or alternately under a high intensity UV light, to cure the non-exposed material.

A stereo lithography system for performing the imaging process is available from 3D Systems, Inc. of Valencia, Calif. In addition, stereographic lithographic processes (3-D) are described in U.S. application Ser. No. 09/259,142, to Farnworth et al. filed on Feb. 26, 1999, in U.S. application Ser. No. 09/652,340, to Farnworth et al. filed on Aug. 31, 2000, and in U.S. provisional application Ser. No. 60/425,567, to Farnworth et al. filed on Nov. 11, 2002, all of which are incorporated herein by reference.

As another alternative for forming the polymer layer 20, patterning can be performed using a conventional photo tool configured to expose a photoimageable material using electromagnetic radiation in the G, H or I broadband. As yet another alternative the polymer layer 20 can be eliminated and the under fill layer 94 (FIG. 3N) can used to protect the base die 12 (FIG. 1C) and the edges of the secondary die 14 (FIG. 1C).

Next, as shown in FIG. 3D, a protective tape 74 is placed on the polymer layer 20 and covers the under bump metallization layers 58. The protective tape 74 protects the circuit side 62 of the base die 12 during the fabrication steps to be hereinafter described, and will be removed near the end of the fabrication process. The protective tape 74 can comprise a high temperature chemical resistant tape, such as a polyimide or an epoxy tape, having an adhesive surface, such as an acrylic, and a desired thickness. Suitable tapes are manufactured by 3M Corporation and Dupont.

Next, as shown in FIG. 3E, vias 78 are formed from a back side 76 of the base die 12, and through the silicon substrate 64 to the die contacts 56. For illustrative purposes, the base die 12 in FIG. 3E has been flipped, such that the back side 76 faces up.

One method for forming the vias 78 uses laser machining to counter bore part way through the substrate 64, followed by etching to complete the vias 78. The vias 78 align with the die contacts 56, and with laser machining taper inward as the depth into the substrate 64 increases. By way of example, the diameters of the vias 78 can be from 10 μm to 2 mils or greater. The vias 78 can also be laser machined or otherwise formed with a shape configured to facilitate deposition of a conductive material therein. For example, the vias 78 can include a large shallow portion, such as a trepan shaped counterbore, and a narrow portion which extends completely through the substrate 64. The vias 78 can then be filled with a metal such as nickel, and a solder alloy can be squeegeed, or otherwise deposited in the large shallow portion, to force the nickel through the narrow portion.

A suitable laser system for performing the laser machining step is manufactured by Electro Scientific, Inc., of Portland, Oreg. and is designated a Model No. 2700. Another laser system is manufactured by XSIL Corporation of Dublin, Ireland and is designated a Model No. "XCISE-200". A representative laser fluence for forming the vias 78 through a silicon substrate having a thickness of about 28 mils (725 μm), is from 2 to 10 watts/per opening at a pulse duration of 20-25 ns, and at a repetition rate of up to several thousand per second. The wavelength of the laser beam can be a standard UV wavelength (e.g., 355 nm).

Next, as shown in FIG. 3F, a thinning step is performed in which the base wafer 54 is ground or polished from the back side 76 to thin the silicon substrate 64. The thinning step can be performed using a mechanical planarization apparatus (e.g., a grinder). One suitable mechanical planarization apparatus is manufactured by Okamoto, and is designated a model no. VG502. The thinning step can also be performed using a chemical mechanical planarization (CMP) apparatus. A suitable CMP apparatus is commercially available from a manufacturer such as Westech, SEZ, Plasma Polishing Systems, or TRUSI. The thinning step can also be performed using an etch back process, such as a wet etch process, a dry etch process or a plasma etching process either performed alone or in combination with mechanical planarization. In the illustrative embodiment, the base wafer 54 is thinned such that the silicon substrate 64 has a thickness Ts of about 280 μm. However, the thickness Ts can be as desired with from 100 μm to 600 μm being representative.

Next, as shown in FIG. 3G, an etching step can be performed, using a suitable wet or dry etchant, to extend the vias 78 completely through the silicon substrate 64 to the die contacts 56. One suitable wet etchant is tetramethylammoniumhydroxide (TMAH). In addition to extending the vias 78, the wet etchant can also further thin the silicon substrate 64. In the illustrative embodiment, the vias 78 are laser machined to within about 10-50 μm of the die contacts 56, and the etching step thins the base wafer 54 to a thickness Ts of about 250 μm. The etching step also cleans and enlarges the inside diameters of the vias 78, and removes amorphous polysilicon and crystalline damaged silicon created in a heat affected zone (HAZ) due to heating by the laser beam.

Next, as shown in FIG. 3H, insulating layers 80 are formed on the inside diameters of the vias 78, and on the back side 76 of the base wafer 54. The insulating layers 80 can be a grown or a deposited material. In the illustrative embodiment, the insulating layers 80 comprise a parylene polymer. Parylene polymers can be deposited from the vapor phase by a process similar to vacuum metallization at pressures of about 0.1 torr. Suitable polymers include parylene C, parylene N, and parylene D. Parylene is available from Advanced Coating of Tempe, Ariz.

One suitable deposition apparatus for depositing parylene polymers is a portable parylene deposition system, designated a model PDS 2010 LABCOATER 2, manufactured by Specialty Coating Systems, of Indianapolis, Ind. The parylene polymer uniformly coat all exposed surfaces of the base wafer 54 to form the insulating layers 80. A thickness range for the insulating layer 80 can be from 0.10 to 76 μm or greater.

Rather than parylene polymers, the insulating layers 80 can be an oxide, such as $SiO_2$, formed by a growth process by exposure of the base wafer 54 to an $O_2$ atmosphere at an elevated temperature (e.g., 950° C.). Alternately, the insulating layers 80 can comprise an electrically insulating material, such as an oxide or a nitride, deposited using a deposition process such as CVD, or a polymer material deposited using a suitable deposition process such as screen printing. In this case, if the insulating material completely fills the vias 80, a subsequent laser drilling step, substantially as previously described, may be required to re-open the vias 78.

Next, as shown in FIG. 3I, a resist layer 82 is formed on the back side of the base wafer 54, covering the insulating layers 80 and filling the vias 78. The resist layer 82 can comprise a suitable negative or positive tone polymer resist deposited to a desired thickness using a suitable deposition process, such as spin on. A suitable resist formulation is sold by Shell Chemical under the trademark "EPON RESIN SU-8".

Next, as shown in FIG. 3J, a laser machining process is performed to remove the resist layer 82 from the vias 78, and to form indentations or openings in the die contacts 56. The laser machining process can be performed substantially as previously described and shown in FIG. 3E for initially forming the vias 78.

Next, as shown in FIG. 3K, the vias 78 are at least partially filled with a conductive material to form the conductive vias 26. In addition, the conductive material fills the indentations or openings formed in the contacts by the previous laser machining process. The conductive vias 78 are thus in physical and electrical contact with the die contacts 56.

The conductive vias 26 can be plugs that completely fill the vias 78, or alternately, can be layers that cover just the inside surfaces or sidewalls of the vias 78. The conductive material can comprise a highly conductive metal, such as aluminum, titanium, nickel, iridium, copper, gold, tungsten, silver, platinum, palladium, tantalum, molybdenum, tin, zinc and alloys of these metals including solder alloys. The above metals can be deposited within the vias 78 using a deposition process, such as electroless deposition, CVD, or electrolytic deposition. In addition, the conductive vias 26 can comprise a single metal or different layers of metal, such as a bonding layer and a non-oxidizing layer.

Rather than being a metal, the conductive material can comprise a conductive polymer, such as a metal filled silicone, or an isotropic epoxy. A conductive polymer can be deposited within the vias 78, as a viscous material, and then cured as required. A suitable deposition process, such as screen printing, or stenciling, can be used to deposit the conductive polymer into the vias 78. Suitable conductive polymers are available from A.I. Technology, Trenton, N.J.; Sheldahl, Northfield, Minn.; and 3M, St. Paul, Minn. Another suitable conductive polymer is a nano-particle paste or ink, having metal nano-particles made of a highly conductive metal, such as aluminum. Nano-particle conductive polymers are commercially available from Superior Micropowders, of Albuquerque, N. Mex.

The conductive vias 26 can also be formed by depositing a metal such as nickel into the vias 78, and then squeegeeing or otherwise forcing a solder allow into the vias 78. In addition, the vias 78 can include an enlarged portion, such as a trepan shaped counterbore, into which the solder can be squeegeed.

The conductive vias 26 can also be formed using the laser machining processes disclosed in U.S. Pat. No. 6,107,109 to Akram et al, U.S. Pat. No. 6,114,240 to Akram et al., and U.S. Pat. No. 6,294,837 B1 to Akram et al., all of which are incorporated herein by reference. Rather than a laser machining processes, the vias 78 can be formed using an etch mask and a suitable etchant. As another alternative, the conductive vias 26 can be formed as described in U.S. Pat. No. 6,313,531 B1 to Geusic et al., which is incorporated herein by reference.

Next, as shown in FIG. 3K, bumped contacts 86 are formed on the conductive vias 26. The bumped contacts 86 can be formed using a deposition process or a bonding process, substantially as previously described for the terminal contacts 18 (FIG. 1C). In the illustrative embodiment, the bumped contacts 86 comprise metal bumps or balls. However, the bumped contacts 86 can also comprise metal pins, conductive polymer bumps, or other types of raised contacts that are known in the art. In addition, the bumped contacts 86 can comprise one or more layers of material, such as under bump metal layers 87 and outer layers 98 made of a non-oxidizing metal such as gold. Further, the bumped contacts 86 are about the same size as the bumped contacts 24 (FIG. 1C) on the secondary dice 14 (60 μm to 100 μm in diameter). As another alternative, the bumped contacts 86 on the base dice 12 can be omitted, and the bumped contacts 24 on the secondary dice 14 can be bonded directly to the under bump metal layers 87 using a bonding process to be hereinafter described.

Next, as shown in FIG. 3L, the base wafer 54 can optionally be tested by placing probe contacts 84 in electrical communication with the bumped contacts 86. Testing of the base wafer 54 can be accomplished using wafer level testing techniques and equipment that are known in the art. For example, the base wafer 54 can be held in a wafer prober in electrical communication with a tester and having a probe card containing the probe contacts 84. The tests can include functionality and parametric tests that are known in the art, and can identify and map defective base dice 12 contained on the base wafer 54. U.S. Pat. No. 6,359,456 B1 to Hembree et al., incorporated herein by reference, describes exemplary wafer level testing equipment.

Next, as shown in FIG. 3M, the bumped contacts 86 can be further processed to facilitate subsequent bonding to the mating bumped contacts 24 on the secondary dice 14. FIG. M illustrates three different embodiments designated I, II and III. In embodiment I the bumped contacts 86 include solder tips 88 and the resist 82 remains on the base wafer 54. In embodiment II the resist 82 is stripped using a suitable stripper. Also in embodiment II, solder bumps 90 completely cover the bumped contacts 86 encircling and making physical contact with the conductive vias 26. The solder tips 88 (embodiment I) or the solder bumps 90 (embodiment II) can be formed using a dipping, wave soldering, stenciling, or screen printing process substantially as previously described for bumped contacts 24 (FIG. 2C). In embodiment III, the resist 82 is again stripped but the bumped contacts 86 are not covered with solder, such that outer layer 98 remains exposed.

Next, as shown in FIG. 3N, the underfill layer 94 can be deposited on the base wafer 54, and on the bumped contacts 86 with embodiments I or II, to facilitate subsequent bonding of the secondary dice 14 to the base wafer 54. The underfill layer 94 also functions to absorb thermal stresses generated between the secondary dice 14 and the base dice 12 in the completed component 10. Alternately, as illustrated in embodiment III of FIG. 3N, a conductive polymer adhesive 92 can be used to bond the secondary dice 14 to the base wafer 54.

The underfill layer 94 can comprise a conventional underfill polymer such as a curable silicone, epoxy or polyimide material. The underfill layer 94 can also comprise a thermoset polymer underfill film, such as an underfill film manufactured by 3M Corporation of Minneapolis, Minn. The underfill layer 94 can be deposited on the base wafer 54 in a viscous state using a conventional deposition apparatus, such as a material dispensing system having a computer controlled nozzle. One suitable system is manufactured by Asymtek of Carlsbad, Calif.

Alternately, as shown in embodiment III of FIG. 3N, the conductive polymer adhesive 92 can be deposited on the base wafer 54 to physically bond the secondary dice 14 to the base wafer 54, and electrically connect the conductive vias 26 to the bumped contacts 24 on the secondary dice 14. In this case, the conductive polymer adhesive 92 can be deposited directly on embodiment III of the bumped contacts 86. The conductive polymer adhesive 92 includes electrically conductive particles 96 which make the electrical connections. Suitable conductive polymer adhesives are commercially available from A.I. Technology, Trenton, N.J.; and 3M, St. Paul, Minn.

Next, as shown in FIG. 3O, the good secondary dice 14 are picked from the dicing tape 50 (FIG. 2D) and placed on the base wafer 54. Again, three embodiments are illustrated. In embodiment I the bumped contacts 24 on the secondary dice 14 are placed in proximity or physical contact with the solder tips 88 on the bumped contacts 86 on the base dice 12. In embodiment II the bumped contacts 24 on the secondary dice 14 are placed in proximity or physical contact with the solder bumps on the bumped contacts 86 on the base dice 12. In embodiment III the bumped contacts 24 on the secondary dice 14 are placed in proximity or physical contact with the bumped contacts 86 on the base dice 12.

Next, as shown in FIG. 3P, a bonding step is performed in which the base wafer 54 with the singulated secondary dice 14 thereon is heated in an oven to a selected temperature for a selected time period. In embodiments I and II, the bonding step is performed at a temperature sufficient to reflow the bumped contacts 24 on the secondary dice 14 and the bumped contacts 86 on the base dice 12 such that metallurgical bonds are formed there between. The bonding step also functions to cure the underfill layer 94, and to adhesively bond the secondary dice 14 to the base dice 12. In embodiment III, the bonding step is performed at a temperature sufficient to cure the conductive polymer adhesive 92 to adhesively bond the secondary dice 14. If required curing can be performed by compressing the conductive polymer adhesive 92 to facilitate formation of separate electrical connections through the conductive particles 96.

Next, as shown in FIG. 3Q, the encapsulant 16 is deposited on the base wafer 54, and initially encapsulates the secondary dice 14. FIG. 3Q is a cross section taken through a pair of secondary dice 14, and a mating pair of base dice 12 on the base wafer 54. In addition, the base dice 12 have bumped contacts 86 configured as embodiment II, such that the resist layer 82 (FIG. 3M) has been stripped, and the solder bumps 90 (FIG. 3M) encircle the conductive vias 26.

The encapsulant 16 can comprise a polymer material such as an epoxy, a silicone, a polyimide or a transfer molded underfill compound (MUF). In addition, these polymer materials can include fillers such as silicates configured to reduce the coefficient of thermal expansion (CTE) and adjust the viscosity of the polymer material. The encapsulant 16 can alternately comprise a laser imageable material, which can be patterned using a stereographic lithography substantially as previously described for polymer layer 20. Alternately, the encapsulant 16 can comprise the underfill layer 94.

Next, as shown in FIG. 3R, another thinning step is performed to thin the secondary dice 14 to a desired thickness. The thinning step can be performed by mechanically planarizing, and/or etching the adhesively bonded secondary dice 14 on the base wafer 54. In this case the secondary dice 14 are ground, and/or etched, from the back side substantially as previously described and shown in the thinning step of FIG. 3F for the base dice 12 on the base wafer 54. As before the resultant thickness Ts of the silicon substrate of the secondary dice 14 can be as desired, with from 100 μm to 600 μm being representative.

Next, as shown in FIG. 3S, the protective tape 74 (FIG. 3R) is removed from the polymer layer 20. In FIG. 3S the base wafer 54 has been flipped such that the protective tape 74 faces up. The protective tape 74 can be removed using a suitable stripper or by peeling it off of the base wafer 54.

Next, as shown in FIG. 3T, a conductive material 100 is deposited into the openings 72 in the polymer layer 20 and onto the die contacts 56 on the base dice 12. In the illustrative embodiment the conductive material 100 comprises solder or another metal deposited using a stenciling process.

Next, as shown in FIG. 3U, the conductive material 100 is heated and reflows into balls or bumps which form the terminal contacts 18. This reflow step can be performed by placing the base wafer 12 in an oven heated to a selected temperature for a selected time period. As the polymer layer 20 is optional, if it is not formed, another process such as screen printing, electroless deposition or electrolytic deposition can be employed to form the terminal contacts 18. However, the polymer layer 20 if used, also performs a protective and rigidifying function in the completed component 10. As another alternative, a separate stencil (not shown) can be used in place of the polymer layer 20.

Next, as shown in FIG. 3V, a singulating step is performed to singulate the components 10 from the base wafer 54. The singulating step can be performed such that the components 10 have symmetry in the X and Y directions. For example, in FIG. 3V the encapsulant 16 for each component 10 is symmetrical on either side of the secondary die 14.

The singulating step can be performed by placing the base wafer 54 on a dicing tape 104, and singulating using a saw substantially as previously described for singulating the secondary wafer 30 (FIG. 2D). In this case the saw kerfs 102 can be thinner than the saw kerfs 52 (FIG. 2D) to account for the size difference between the secondary dice 14 and the base dice 12.

Each secondary die 14 has an outline (footprint) that is smaller than the outline (footprint) of its mating base die 12. In addition, the component 10 has an outline (footprint) that is substantially identical to that of the base die 12 contained therein. Further, the component 10 has a thickness T that is substantially equivalent to a conventional semiconductor die. In the illustrative embodiment the thickness T is from about 20 μm to 1500 μm.

Figure 4A:
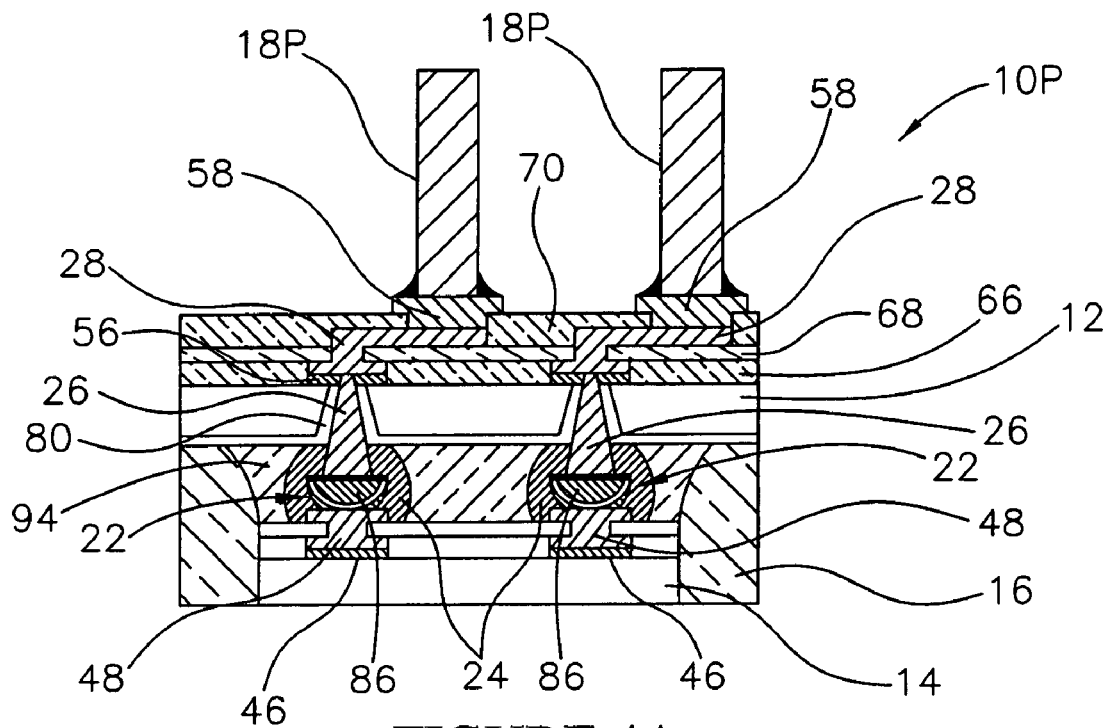
FIG. 4A is a schematic cross sectional view equivalent to FIG. 1C of an alternate embodiment component having terminal contacts which comprise pins.

Referring to FIG. 4A, an alternate embodiment component 10P is illustrated. The component 10P is substantially similar to the component 10 (FIG. 1C), and is constructed using substantially the same fabrication method to be hereinafter described. However, the component 10P includes terminal contacts 18P which comprise pins in an area array, such as a pin grid array, rather than bumps or balls as in component 10 (FIG. 1C). In addition, the polymer layer 20 (FIG. 1C) has been eliminated in the component 10P. The terminal contacts 18P can be welded, brazed, soldered, or otherwise bonded, to the under bump metallization layers 58, using techniques and equipment that are known in the art.

Figure 4B:
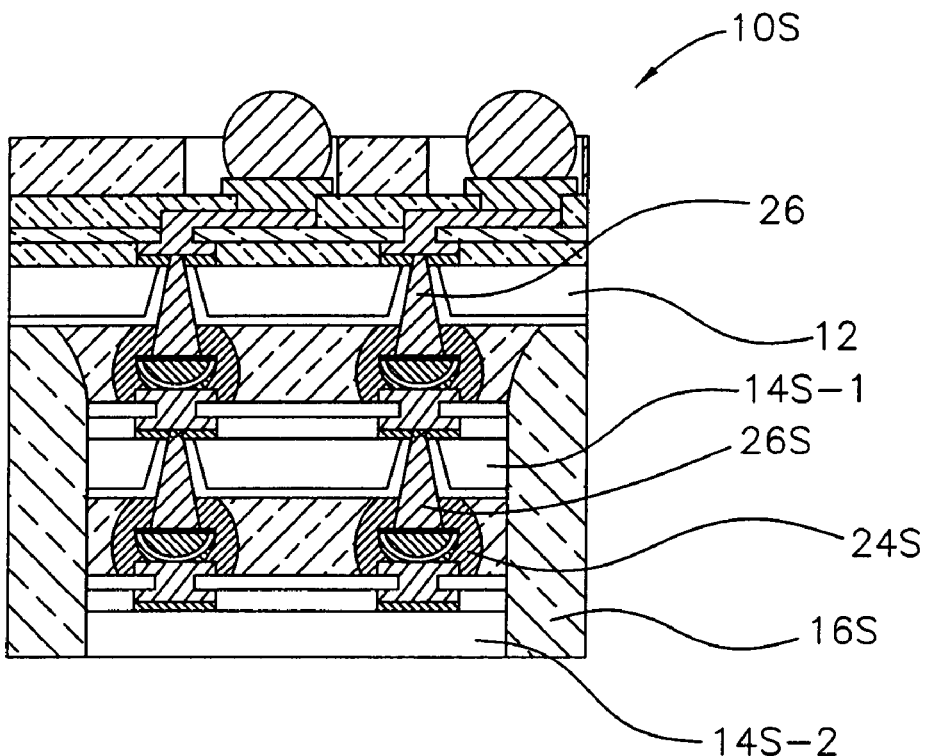
FIG. 4B is a schematic cross sectional view equivalent to FIG. 1C of an alternate embodiment component having two secondary dice stacked and bonded to one another and to a base die.

Referring to FIG. 4B, an alternate embodiment component 10S is illustrated. The component 10S is substantially similar to the component 10 (FIG. 1C), and is constructed using substantially the same fabrication method illustrated in FIGS. 2A-2E and FIGS. 3A-3V. However, the component 10S includes a first secondary die 14S-1, and a second secondary die 14S-2 bonded to one another and to the base die 12. The first secondary die 14S-1 also includes conductive vias 26S constructed substantially as previously described for the conductive vias 26. In addition, bumped contacts 24S on the second secondary die 14S-2 are bonded to the conductive vias 26S, substantially as previously described for bumped contacts 24 (FIG. 1C). Further, an encapsulant 16S substantially encapsulates the first secondary die 14S-1 and the second secondary die 14S-2. Alternately the component 10S can include more than two stacked and bonded secondary dice 14S-1, 14S-2 (e.g., 3-10 secondary dice).

Figure 4C:
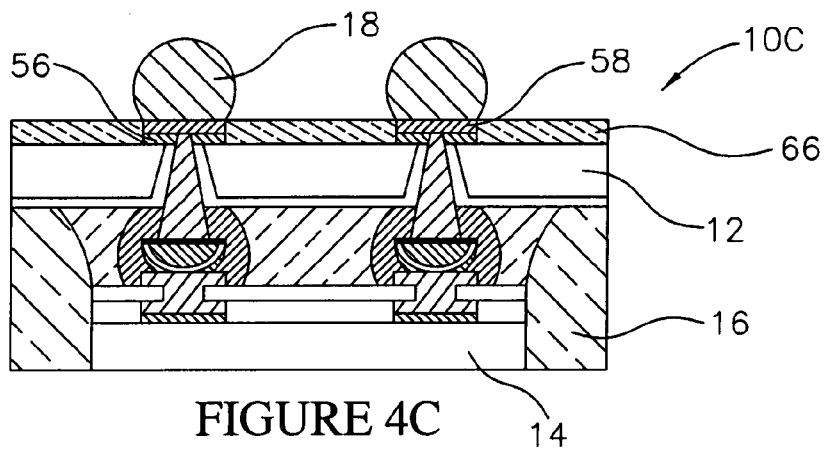
FIG. 4C is a schematic cross sectional view equivalent to FIG. 1C of an alternate embodiment component having direct connect base die with no redistribution layer.

Referring to FIG. 4C, an alternate embodiment component 10C is illustrated. The component 10C is substantially similar to the component 10 (FIG. 1C), and is constructed using substantially the same fabrication method illustrated in FIGS. 2A-2E and FIGS. 3A-3V. However, the component 10C does not include the redistribution conductors 56 (FIG. 1C). Rather, the terminal contacts 18, and the under bump metallization layers 58 for the terminal contacts 18, are formed directly on the die contacts 56 for the base die 12. As such, the pattern of the terminal contacts 18 matches the pattern of the die contacts 56. In addition, the polymer layer 20 (FIG. 1C) has been eliminated.

Figure 4D:
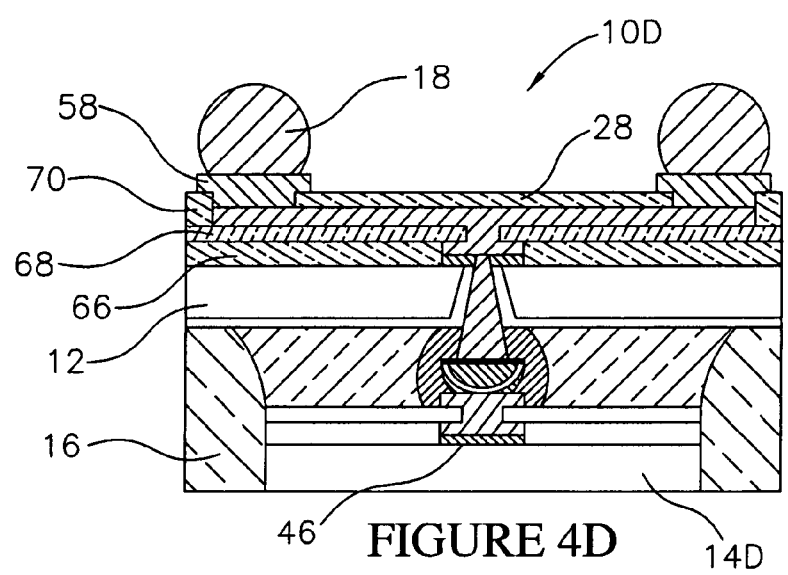
FIG. 4D is a schematic cross sectional view equivalent to FIG. 1C of an alternate embodiment component having a center connect secondary die.

Referring to FIG. 4D, an alternate embodiment component 10D is illustrated. The component 10D is substantially similar to the component 10 (FIG. 1C), and is constructed using substantially the same fabrication method illustrated in FIGS. 2A-2E and FIGS. 3A-3V. However, a secondary die 14D of the component 10D includes a single row of the die contacts 46 along a center line of the secondary die 14D, rather than two rows of the die contacts 46, as with the component 10 (FIG. 1C). In addition, the terminal contacts 18 fan out on either side of the die contacts 46.

Figure 4E:
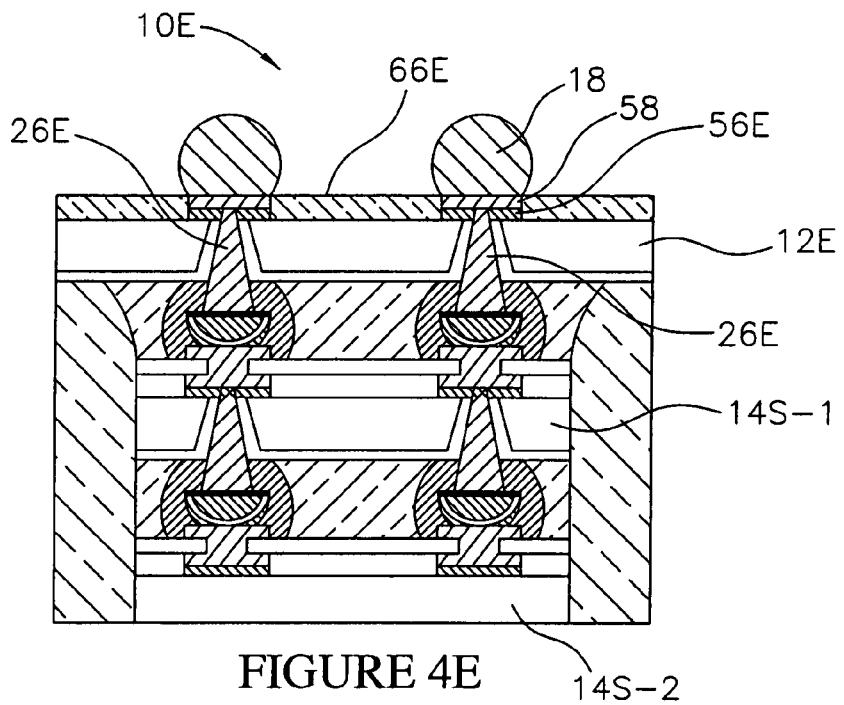
FIG. 4E is a schematic cross sectional view equivalent to FIG. 1C of an alternate embodiment component having an interconnect base die and stacked secondary dice.

Referring to FIG. 4E, an alternate embodiment component 10E is illustrated. The component 10E is substantially similar to the component 10S (FIG. 4B), and is constructed using substantially the same fabrication method illustrated in FIGS. 2A-2E and FIGS. 3A-3V. However, a base interconnect 12E is not a semiconductor die and contains no integrated circuits, but merely performs a support and interconnect function. The base interconnect 12E can comprise a semiconductor material, a ceramic material, or a plastic material. In addition, the base interconnect 12E includes interconnect contacts 56E, and conductive vias 26E on which the under bump metallization layers 58 for the terminal contacts 18 are formed.

Figure 4F:
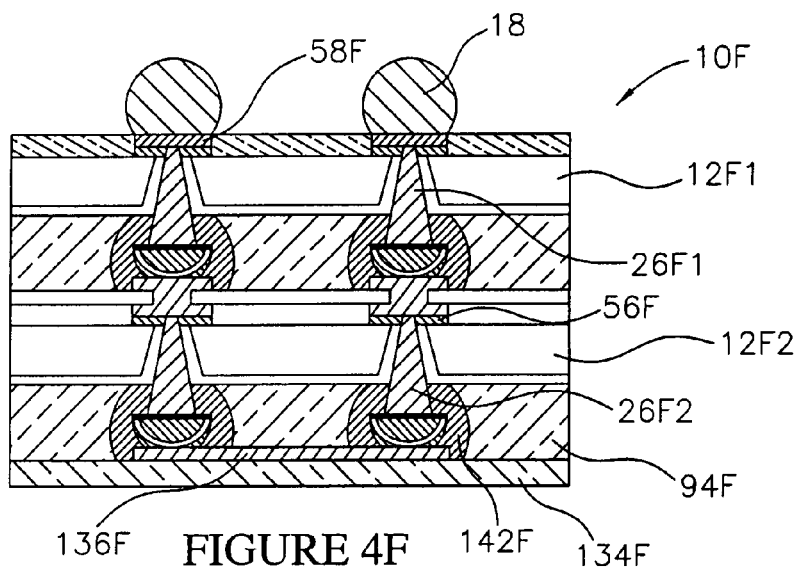
FIG. 4F is a schematic cross sectional view equivalent to FIG. 1C of an alternate embodiment component having stacked base dice and a cap plate.

Referring to FIG. 4F, an alternate embodiment component 10F is illustrated. The component 10F is substantially similar to the component 10 (FIG. 1C), and is constructed using substantially the same fabrication method illustrated in FIGS. 2A-2E and FIGS. 3A-3V. However, the component 10F includes two base dice 12F1, 12F2, which are stacked and bonded to one another. The base dice 12F1, 12F2 include conductive vias 26F1, 26F2, which function substantially as previously described for the conductive vias 26 (FIG. 1C) on the component 10 (FIG. 1C). The component 10F also includes a cap plate 134F bonded to the base die 12F2 using an underfill layer 94F. The cap plate 134F can comprise a material such as silicon, ceramic or plastic, on which patterns of conductors 136F are formed. In addition, the cap plate 134F includes bumped contacts 142F in electrical communication with the conductors 136F, and bonded to the conductive vias 26F2 on the base die 12F2. The conductors 136F electrically connect (i.e., short) selected contacts 56F (e.g., power and ground connections) on the base dice 12F1, 12F2 to one another. The cap plate 134F can comprise a semiconductor, a ceramic or a plastic material, on which the conductors 136F and the bumped contacts 142F can be formed using semiconductor fabrication techniques.

Figure 4G:
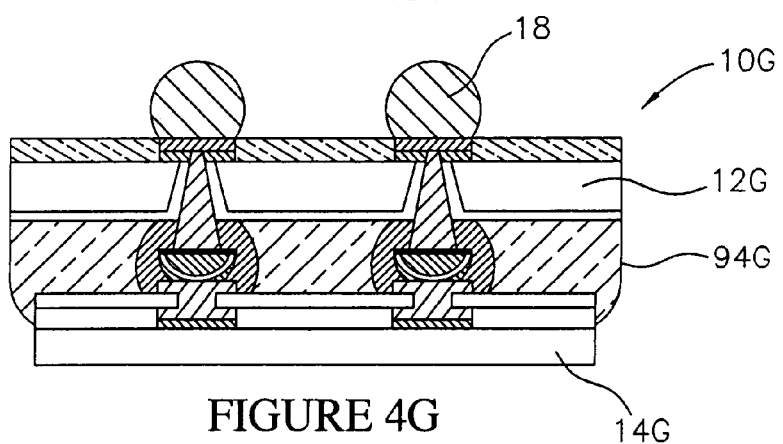
FIG. 4G is a schematic cross sectional view equivalent to FIG. 1C of an alternate embodiment component having an underfill layer configured as an encapsulant.

Referring to FIG. 4G, an alternate embodiment component 10G is illustrated. The component 10G is substantially similar to the component 10C (FIG. 4C), and is constructed using substantially the same fabrication method illustrated in FIGS. 2A-2E and FIGS. 3A-3V. The component 10G includes a base die 12G and a secondary die 14G. The component 10G also includes an underfill layer 84G, which also functions as an encapsulant for the component 10G. The underfill layer 84G covers the back side of the base die 12G and pots the secondary die 14G to the base die 12G.

Figure 4H:
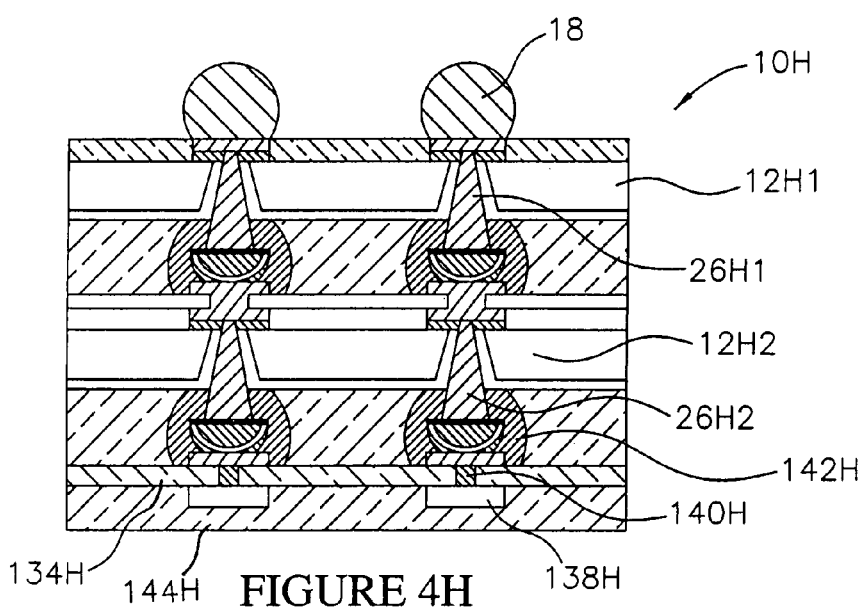
FIG. 4H is a schematic cross sectional view equivalent to FIG. 1C of an alternate embodiment component having stacked base dice and a cap plate with electronic components thereon.

Referring to FIG. 4H, an alternate embodiment component 10H is illustrated. The component 10H is substantially similar to the component 10F (FIG. 4F), and is constructed using substantially the same fabrication method illustrated in FIGS. 2A-2E and FIGS. 3A-3V. The component 10H includes two base dice 12H1, 12H2, which are stacked and bonded to one another. The base dice 12H1, 12H2 include conductive vias 26H1, 26H2, which function substantially as previously described for the conductive vias 26 (FIG. 1C) on the component 10 (FIG. 1C). The component 10H also includes a cap plate 134H bonded to the base die 12H2 using an underfill layer 94H. The cap plate 134H can comprise a material such as silicon, ceramic or plastic on which patterns of interlevel conductors 140H are formed. In addition, the cap plate 134H includes bumped contacts 142H bonded to the conductive vias 26H2 on the base die 12H2. The cap plate 134H also includes electronic components 138H, such as capacitors, diodes or other electronic elements, in electrical communication with the interlevel conductors 140H, and configured in a desired electronic circuit the component 10H also includes an insulating layer 144H, such as a deposited polymer, formed on the cap plate 134H, and on the electronic components 138H.

Referring to FIGS. 5A-5D, flow charts of the fabrication method illustrated in FIGS. 2A-2E and 3A-3V are shown.

Figure 5A:
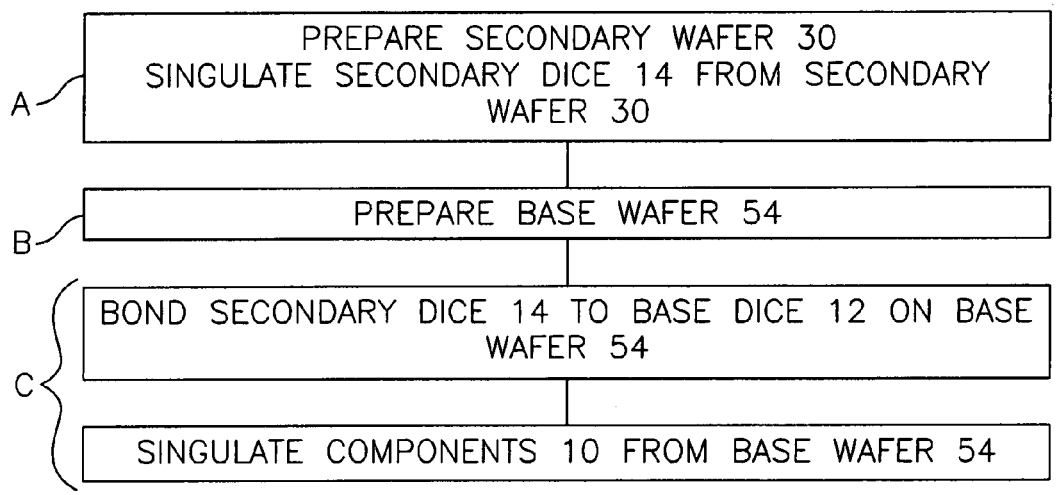
FIG. 5A is a flow diagram illustrating broad steps in the fabrication method.

In FIG. 5A, the fabrication method is broken into three basic steps—Steps A, B and C.

Step A—Prepare the secondary wafer 30 and singulate the secondary dice 14 from the secondary wafer 30.

Step B—Prepare the base wafer 54.

Step C—Bond the secondary dice 14 to the base dice 12 on the base wafer 54 and singulate the components 10 from the base wafer 54.

The basic fabrication method can be modified by directly bonding the secondary wafer 30 to the base wafer 54, and then singulating the components 10 from the bonded wafers. As another alternative, the base dice 12 can be singulated, and the singulated secondary dice 14 can be bonded to the singulated base dice 12.

Figure 5B:
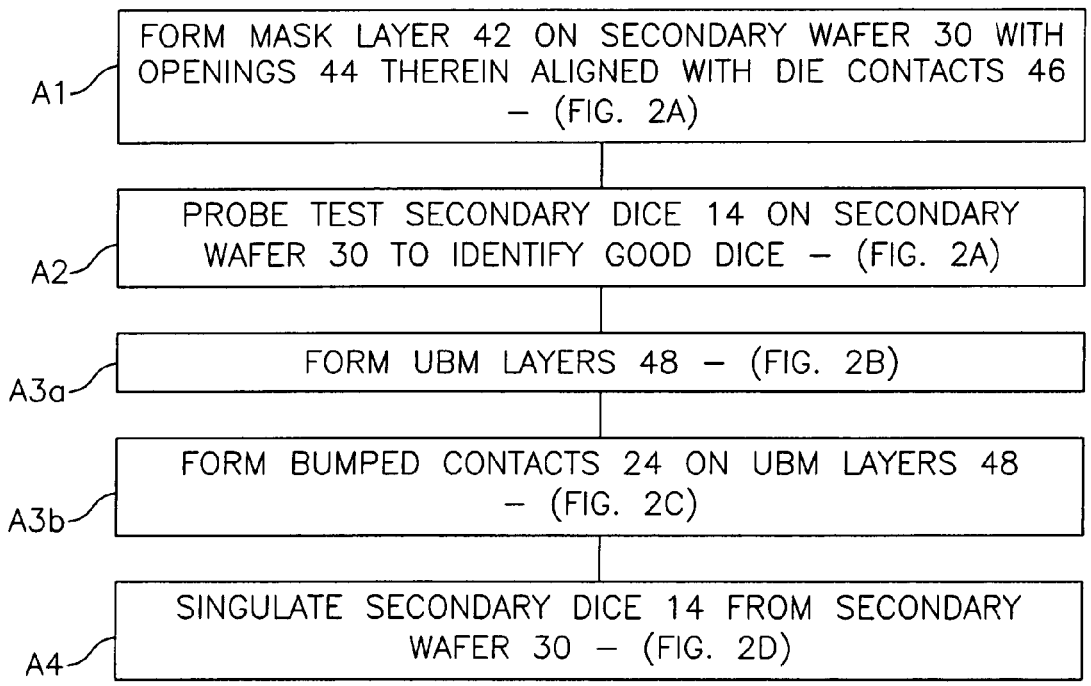
FIG. 5B is a flow diagram illustrating steps performed on the secondary wafer in the fabrication method.

In FIG. 5B, Step A is broken into Steps A1-A4.

Step A1—Form the mask layer 42 on the secondary wafer with the openings 44 therein aligned with the die contacts 46 (FIG. 2A).

Step A2—Probe test the secondary dice 14 on the secondary wafer 30 to identify "Good Dice" (FIG. 2A).

Step A3a—Form the UBM layers 48 (FIG. 2B).

Step A3b—Form the bumped contacts 24 on the UBM layers 48 (FIG. 2C).

Step A4—Singulate the secondary dice 14 from the secondary wafer 30 (FIG. 2D).

Figure 5C:
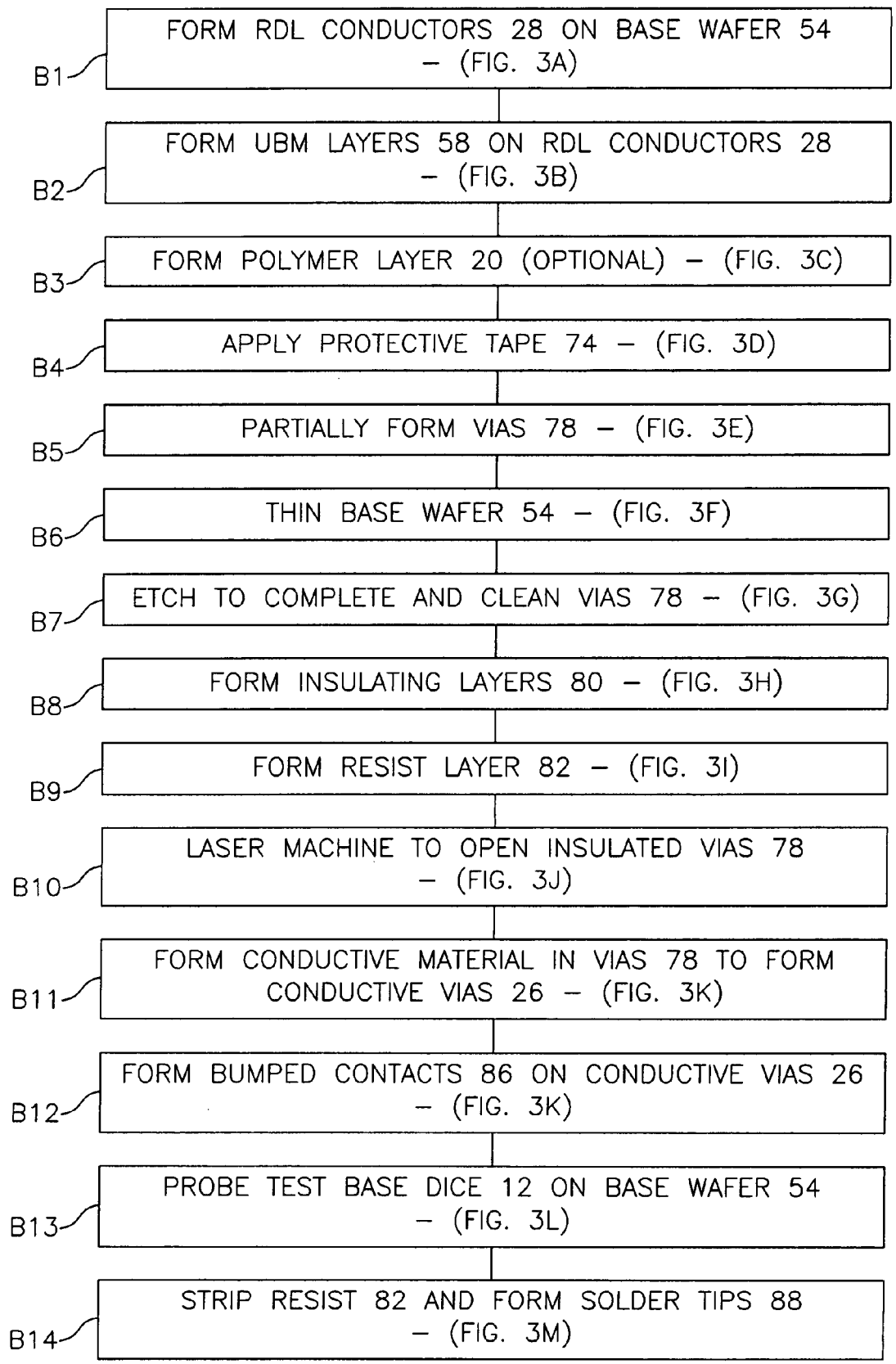
FIG. 5C is a flow diagram illustrating steps performed on the base wafer in the fabrication method.

In FIG. 5C, Step B is broken into Steps B1-B14.

Step B1—Form the RDL conductor 28 on the base wafer 54 (FIG. 3A).

Step B2—Form the UBM layers 58 on the RDL conductors 28 (FIG. 3B).

Step B3—Form the polymer layer 20 (optional) (FIG. 3C).

Step B4—Apply the protective tape 74 (FIG. 3D).

Step B5—Partially form the vias 78 (FIG. 3E).

Step B6—Thin the base wafer 54 (FIG. 3F).

Step B7—Etch to complete and clean the vias 78 (FIG. 3G).

Step B8—Form the insulating layers 80 (FIG. 3H).

Step B9—Form the resist layer 82 (FIG. 3I).

Step B10—Laser machine to open the insulated vias 78 (FIG. 3J).

Step B11—Form the conductive material in the vias 78 to form the conductive vias 26 (FIG. 3K).

Step B12—Form the bumped contacts 86 on the conductive vias 26 (FIG. 3K).

Step B13—Probe test the base dice 12 on the base wafer 54 (FIG. 3K).

Step 14—Strip the resist 82 and form the solder tips 88 (FIG. 3M).

Figure 5D:
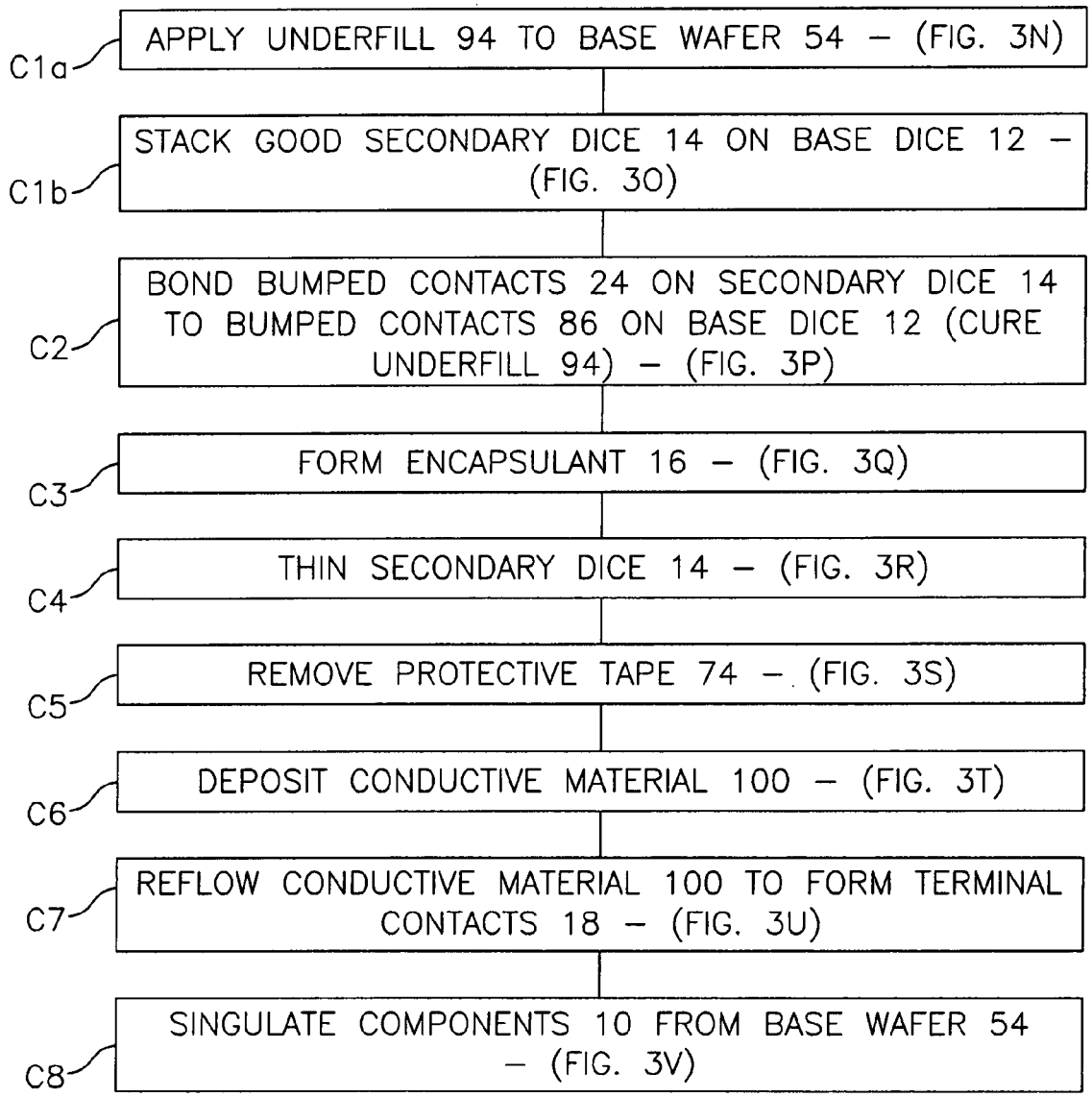
FIG. 5D is a flow diagram illustrating steps for mounting the secondary dice to the base dice on the base wafer.

In FIG. 5D, Step C is broken into Steps C1a-C8.

C1a—Apply the underfill layer 94 to the base wafer 54 (FIG. 3N).

C1b—Stack good secondary dice 14 on the base dice 12 (FIG. 3O)

C2—Bond the bumped contacts 24 on the secondary dice 14 to the bumped contacts 86 on the base dice 12 (also cure the underfill layer 94) (FIG. 3P).

C3—Form the encapsulant 16 (FIG. 3Q).

C4—Thin the secondary dice 14 (FIG. 3R).

C5—Remove the protective tape 74 (FIG. 3S).

C6—Deposit the conductive material 100 (FIG. 3T).

C7—Reflow the conductive material 100 to form the terminal contacts 18 (FIG. 3O).

C8—Singulate the components 10 from the base wafer 54 (FIG. 3V).

Miniscus Bumps/Flip Chip Bonder (M8)

Referring to FIGS. 6A-6G, flow diagrams illustrating steps in the fabrication method performed using different semiconductor fabrication equipment are shown. The flow diagrams in FIGS. 6A-6G, describe exemplary equipment and processes used to align and bond the base dice 12 to the secondary dice 14. In addition, the flow diagrams describe exemplary equipment and processes for forming the bumped contacts 24 (inner lead bonds-ILB) on the secondary dice 14, the bumped contacts 86 (inner lead bonds-ILB) on the base dice 12 and the terminal contacts 18 (outer lead bonds-OLB) on the base dice 14.

Figure 6A:
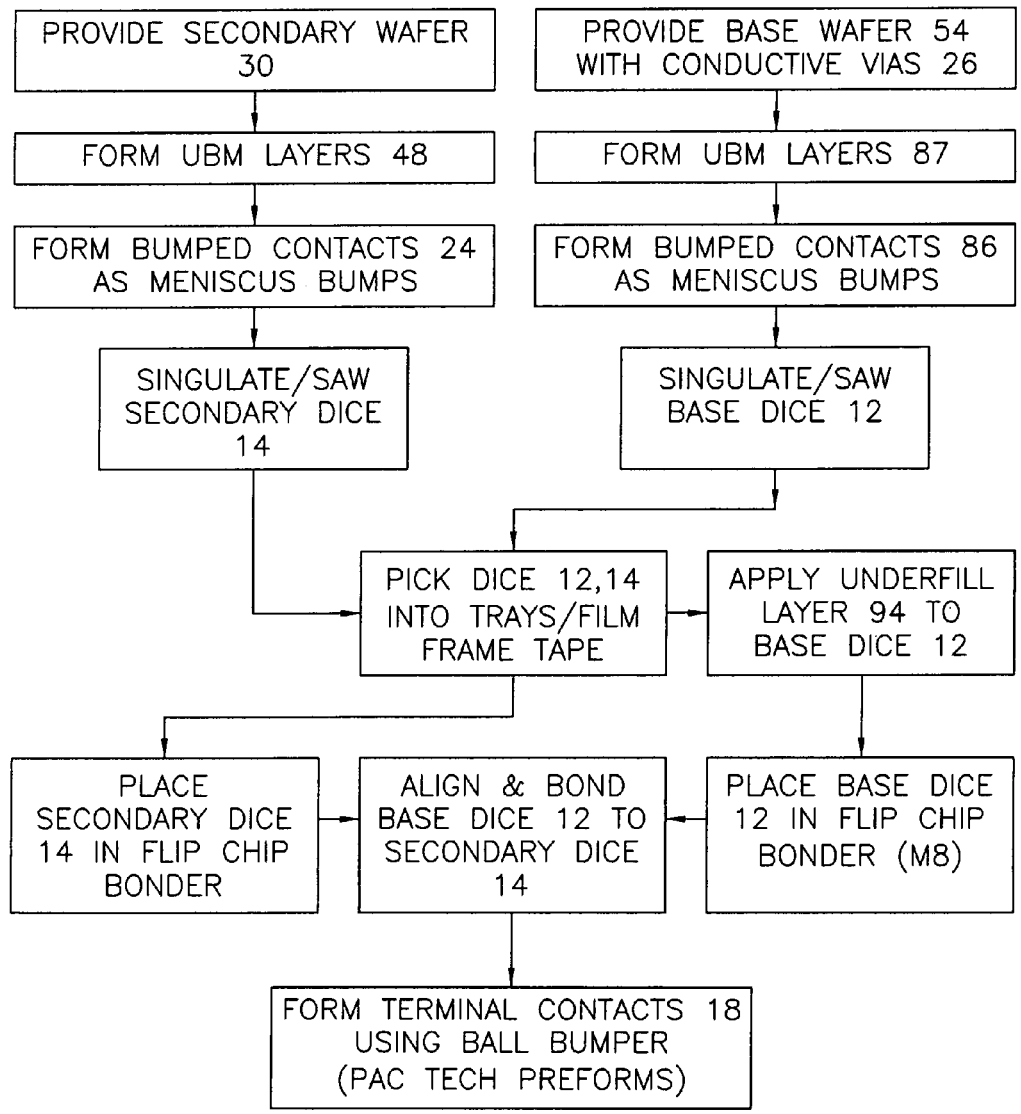
FIGS. 6A-6G are flow diagrams illustrating steps of the fabrication method performed using different semiconductor fabrication equipment.

FIG. 6A describes a die level bonding process using singulated base dice 12 and singulated secondary dice 14. In addition, the process uses meniscus bumps for the bumped contacts 24, 86 formed using a wave soldering process. Initially, as shown on the left hand side of FIG. 6A, the secondary wafer 30 (FIG. 2) is provided. In addition, the UBM layers 48 (FIG. 2B) for the bumped contacts 24 (FIG. 2C) are formed on the die contacts 46 (FIG. 2B) using a suitable process, such as electroless deposition. Next, the bumped contacts 24 (FIG. 2C) are formed on the secondary dice 14 using a wave soldering process. An exemplary wave soldering process is described in U.S. Pat. No. 6,372,624 to Farnworth et al., which is incorporated herein by reference. As also shown on the left hand side of FIG. 6A, the secondary dice 14 are singulated from the secondary wafer 30 using a suitable process such as sawing.

As shown on the right hand side of FIG. 6A, the base wafer 54 (FIG. 3) is provided. The base wafer 54 can include the conductive vias 26 (FIG. 3K) and the insulating layers 80 (FIG. 3H) formed as previously described. In addition, the base wafer 54 can include the redistribution conductors 28 (FIG. 3A), and the redistribution insulating layers 68, 70 formed as previously described. Next, the UBM layers 87 (FIG. 3K) for the bumped contacts 86 (FIG. 3K) are formed on the conductive vias 26. The base wafer 54 is then singulated into the base dice 12.

As shown in the middle of FIG. 6A, the singulated dice 12, 14 are picked and placed into a tray, or onto a film frame tape, using a suitable manual or automated apparatus, such as a pick and place mechanism. As shown on the right hand side of FIG. 6A, the underfill layers 94 are applied to the singulated base dice 12 using a suitable manual or automated apparatus. In addition, the singulated secondary dice 14, and the singulated base dice 12 are placed in a flip chip bonder. A flip chip bonder is described in U.S. Pat. No. 4,899,921 to Bendat et al., which is incorporated herein by reference. In addition, a suitable flip chip bonder is manufactured by Research Devices of Piscataway, N.J., and is designated an "M8 Visible Flip Chip Aligner Bonder". As also shown in the middle portion of FIG. 6A, the flip chip bonder is used to bond the singulated base dice 12 to the singulated secondary dice 14. Next, the terminal contacts 18, are formed on the base dice 12 using a ball bumper and solder preforms. One suitable ball bumper, and the solder preforms as well, are manufactured by Pac Tech Packaging Technologies of Falkensee, Germany.

Ball Bumper (Pac Tech 80 μm/Flip Chip Bonder (M8)

Figure 6B:
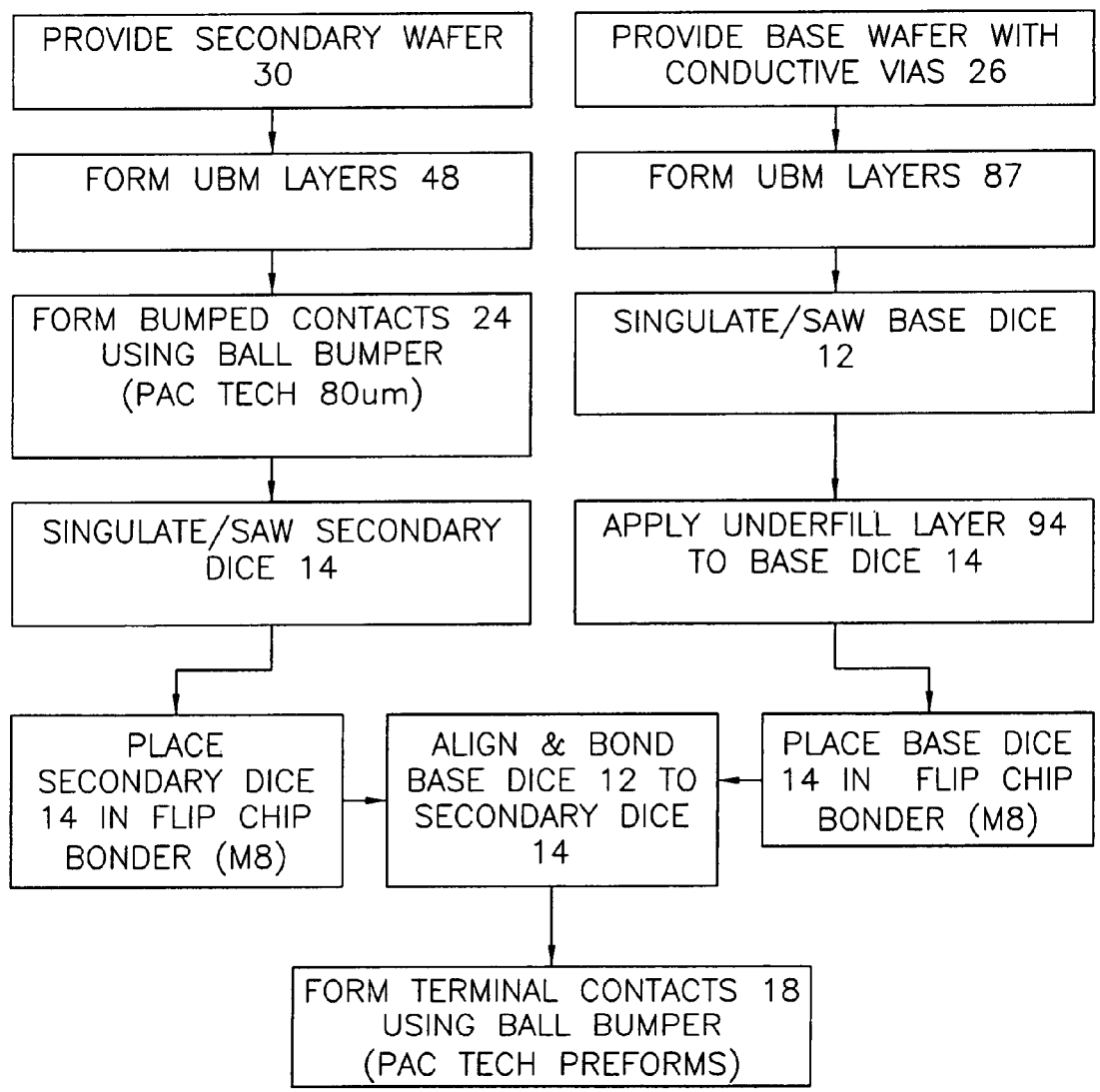

FIG. 6B describes a die level bonding process using singulated base dice 12 and singulated secondary dice 14. In addition, the process uses a ball bumper to form the bumped contacts 24, which are bonded directly to the UBM layers 87 on the base dice 12. Initially, as shown on the left hand side of FIG. 6B, the secondary wafer 30 (FIG. 2) is provided. In addition, the UBM layers 48 (FIG. 2B) for the bumped contacts 24 (FIG. 2C) are formed on the die contacts 46 (FIG. 2B) using a suitable process, such as electroless deposition. Next, the bumped contacts 24 (FIG. 2C) are formed on the secondary dice 14 using a ball bumper. One suitable ball bumper, capable of depositing solder bumps on the order of 80 μm or smaller, is manufactured by Pac Tech Packaging Technologies of Falkensee, Germany. As also shown on the left hand side of FIG. 6B, the secondary dice 14 are singulated from the secondary wafer 30 using a suitable process such as sawing. In addition, the singulated secondary dice 14 are placed in a flip chip bonder such as the previously described "M8" manufactured by Research Devices of Piscataway, N.J.

As shown on the right hand side of FIG. 6B, the base wafer 54 (FIG. 3) is provided. The base wafer 54 can include the conductive vias 26 (FIG. 3K) and the insulating layers 80 (FIG. 3H) formed as previously described. In addition, the base wafer 54 can include the redistribution conductors 28 (FIG. 3A), and the redistribution insulating layers 68, 70 formed as previously described. Next, the UBM layers 87 (FIG. 3K) are formed on the conductive vias 26. The base wafer 54 is then singulated into the base dice 12. As shown on the right hand side of FIG. 6B, the underfill layers 94 are applied to the singulated base dice 12 using a suitable manual or automated apparatus. In addition the singulated base dice 14 are placed in the M8 flip chip bonder.

As shown in the middle of FIG. 6B, the flip chip bonder is used to align and bond the bumped contacts 24 on the secondary dice 14 to the UBM layer 87 on the base dice 12. Next, the terminal contacts 18, are formed on the base dice 12 using a ball bumper and solder preforms as previously described.

Ball Bumper (Pac Tech 80 μm)/Ball Bumper (Pac Tech LAPLACE)

Figure 6C:
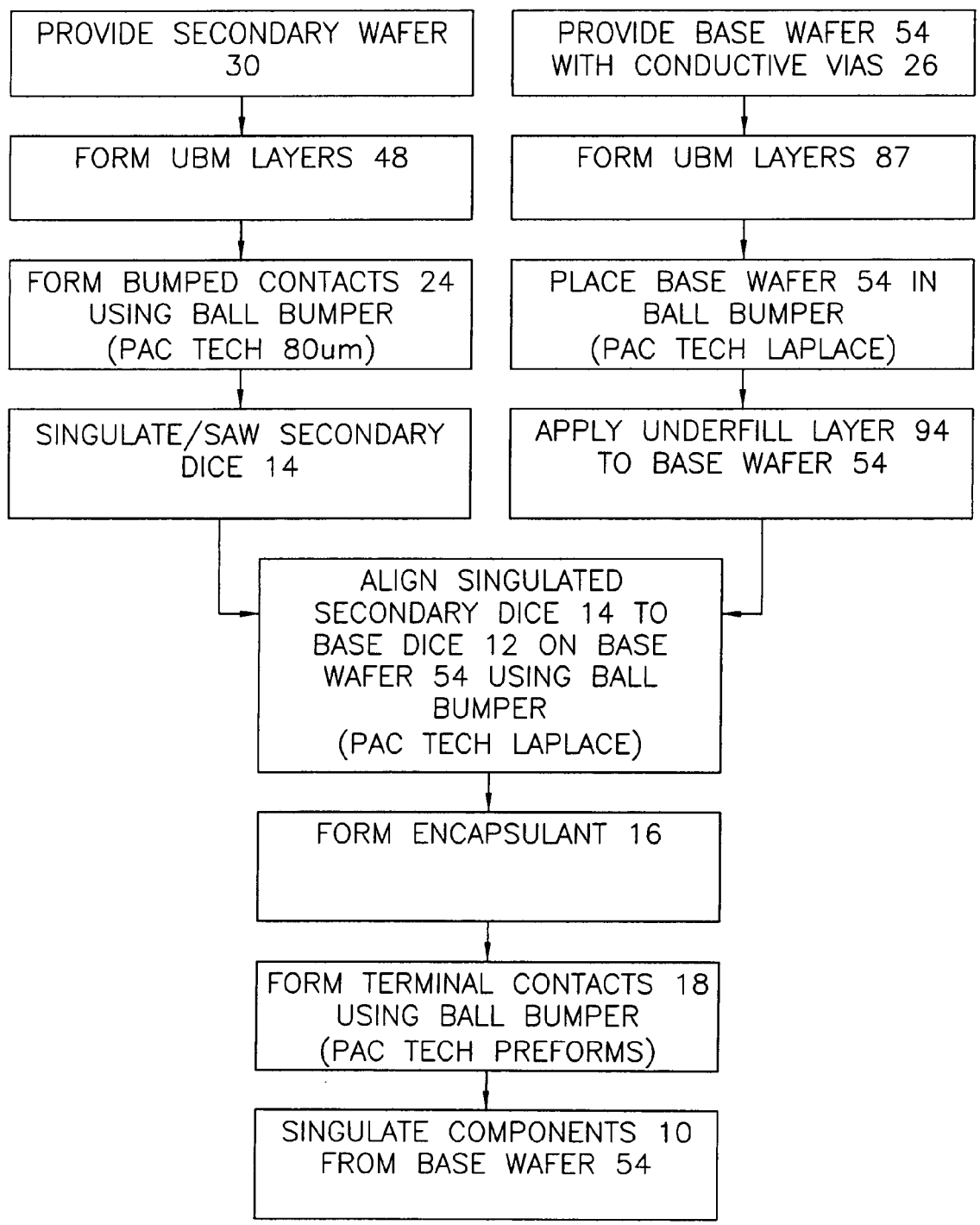

FIG. 6C describes a wafer level bonding process using singulated secondary dice 14 and the base wafer 54. In addition, the process uses a first ball bumper to form the bumped contacts 24 on the secondary dice 14, and a second ball bumper with a laser to bond the bumped contacts 24 to the UBM layers 87 on the base dice 12. Initially, as shown on the left hand side of FIG. 6C, the secondary wafer 30 (FIG. 2) is provided. In addition, the UBM layers 48 (FIG. 2B) for the bumped contacts 24 (FIG. 2C) are formed on the die contacts 46 (FIG. 2B) using a suitable process, such as electroless deposition. Next, the bumped contacts 24 (FIG. 2C) are formed on the secondary dice 14 using a ball bumper. One suitable ball bumper is the previously described 80 μm ball bumper manufactured by Pac Tech Packaging Technologies of Falkensee, Germany. As also shown on the left hand side of FIG. 6C, the secondary dice 14 are singulated from the secondary wafer 30 using a suitable process such as sawing.

As shown on the right hand side of FIG. 6C, the base wafer 54 (FIG. 3) is provided. The base wafer 54 can include the conductive vias 26 (FIG. 3K), and the insulating layers 80 (FIG. 3H) formed as previously described. In addition, the base wafer 54 can include the redistribution conductors 28 (FIG. 3A), and the redistribution insulating layers 68, 70 formed as previously described. Next, the UBM layers 87 (FIG. 3K) are formed on the conductive vias 26. In addition, the base wafer 54 is placed in a second ball bumper which includes a laser configured to heat through the base wafer 54 to heat and bond the bumped contacts 24 on the secondary dice 14 to the UBM layers 87 on the base dice 12. One suitable ball bumper is manufacture by Pac Tech Packaging Technologies of Falkensee, Germany, and is designated the "LAPLACE". Next, the underfill layers 94 are applied to the base wafer 54 mounted to the second ball bumper.

Next, as shown in the center block of FIG. 6C, the singulated secondary dice 14 are aligned with and bonded to the base dice 12 on the base wafer 54 using the second ball bumper. In addition, as shown in the next blocks, the encapsulants 16 are formed as previously described, and the terminal contacts 18, are formed on the base dice 12 using a ball bumper and solder preforms as previously described. As shown in the last block of FIG. 6C, the components 10 are singulated from the base wafer 54, using a suitable process such as sawing.

Ball Bumper (Pac Tech 80 μm)/Flip Chip Bonder (Datacon)

Figure 6D:
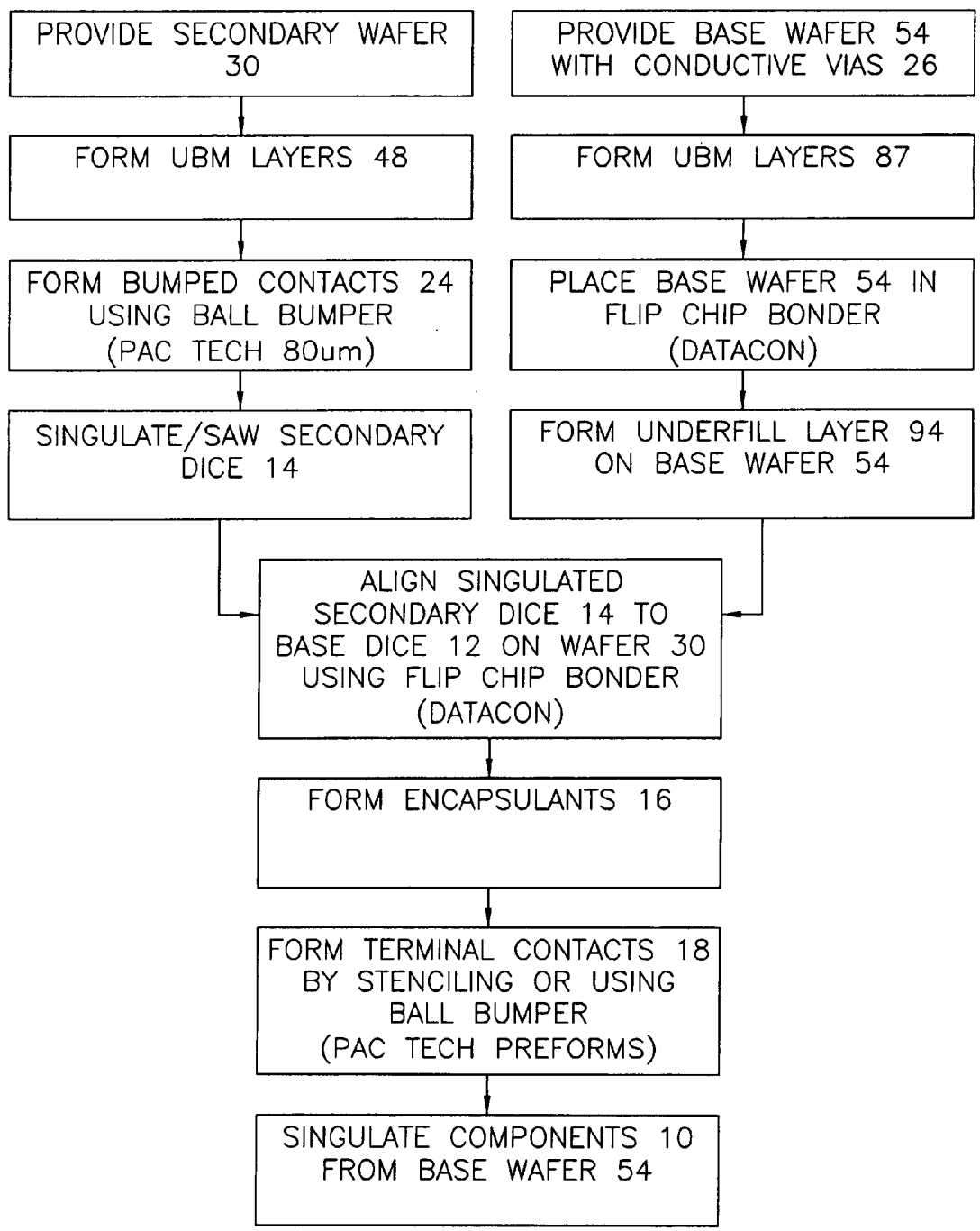

FIG. 6D describes a wafer level bonding process using singulated secondary dice 14 which are bonded to the base wafer 54. In addition, the process of FIG. 6D uses a ball bumper to form the bumped contacts 24 on the secondary dice 14, and a flip chip bonder to bond the bumped contacts 24 on the secondary dice 14 to the UBM layers 87 on the base dice 12 on the base wafer 54. Initially, as shown on the left hand side of FIG. 6D, the secondary wafer 30 (FIG. 2) is provided. In addition, the UBM layers 48 (FIG. 2B) for the bumped contacts 24 (FIG. 2C) are formed on the die contacts 46 (FIG. 2B) using a suitable process, such as electroless deposition. Next, the bumped contacts 24 (FIG. 2C) are formed on the secondary dice 14 using a ball bumper. One suitable ball bumper is the previously described 80 μm ball bumper manufactured by Pac Tech Packaging Technologies of Falkensee, Germany. As also shown on the left hand side of FIG. 6C, the secondary dice 14 are singulated from the secondary wafer 30 using a suitable process such as sawing.

As shown on the right hand side of FIG. 6D, the base wafer 54 (FIG. 3) is provided. The base wafer 54 can include the conductive vias 26 (FIG. 3K), and the insulating layers 80 (FIG. 3H) formed as previously described. In addition, the base wafer 54 can include the redistribution conductors 28 (FIG. 3A), and the redistribution insulating layers 68, 70 formed as previously described. Next, the UBM layers 87 (FIG. 3K) are formed on the conductive vias 26. In addition, the base wafer 54 is placed in a flip chip bonder configured to bond the singulated secondary dice 14 to the base wafer 54. One suitable wafer sized flip chip bonder is manufactured by Datacon Semiconductor Equipment GmbH, Radfeld, AT. Next, the underfill layers 94 are applied to the base wafer 54 mounted to the flip chip bonder.

Next, as shown in the center portion of FIG. 6D, the singulated secondary dice 14 are aligned with and bonded to the base dice 12 on the base wafer 54 using the flip chip bonder. In addition, the encapsulants 16 are formed as previously described. As also shown in the center of FIG. 6D, the terminal contacts 18, are formed on the base dice 12 using a ball bumper and solder preforms as previously described. As shown in the last block of FIG. 6D, the components 10 are singulated from the base wafer 54.

Wager Bonder (EVG)

Figure 6E:
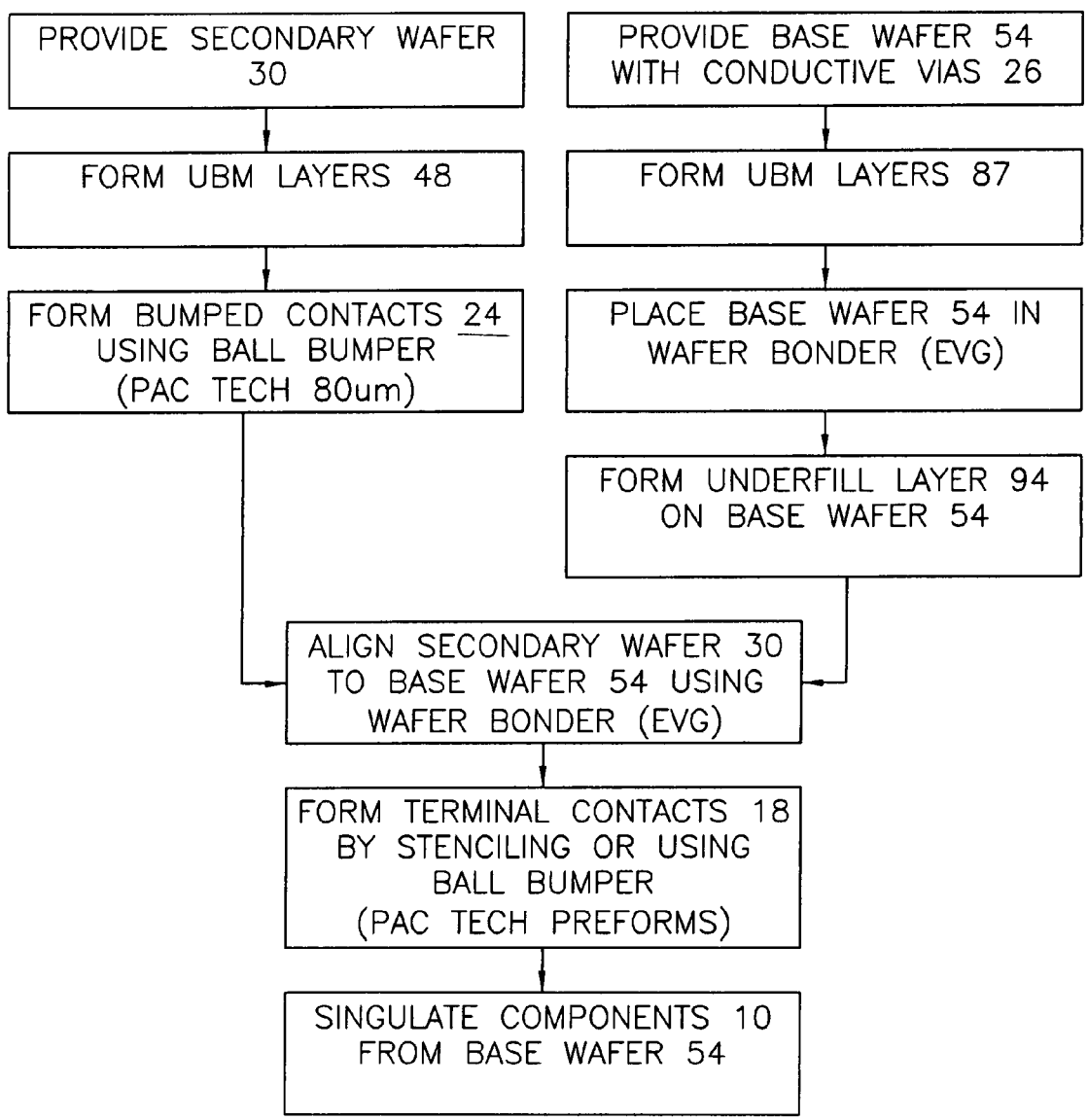

FIG. 6E describes a wafer level bonding process in which the un-singulated secondary wafer 30 is bonded to the un-singulated base wafer 54. The process described in FIG. 6E also uses a ball bumper to form the bumped contacts 24 on the secondary dice 14 on the secondary wafer 30, and a wafer bonder to bond the bumped contacts 24 to the UBM layers 87 on the base dice 12 on the base wafer 54. Initially, as shown on the left hand side of FIG. 6E, the secondary wafer 30 (FIG. 2) is provided. In addition, the UBM layers 48 (FIG. 2B) for the bumped contacts 24 (FIG. 2C) are formed on the die contacts 46 (FIG. 2B) using a suitable process, such as electroless deposition. Next, the bumped contacts 24 (FIG. 2C) are formed on the secondary dice 14 using a ball bumper. One suitable ball bumper is the previously described 80 μm ball bumper manufactured by Pac Tech Packaging Technologies of Falkensee, Germany.

As shown on the right hand side of FIG. 6E, the base wafer 54 (FIG. 3) is provided. The base wafer 54 can include the conductive vias 26 (FIG. 3K), and the insulating layers 80 (FIG. 3H) formed as previously described. In addition, the base wafer 54 can include the redistribution conductors 28 (FIG. 3A), and the redistribution insulating layers 68, 70 formed as previously described. Next, the UBM layers 87 (FIG. 3K) are formed on the conductive vias 26. In addition, the base wafer 54 is placed in a wafer bonder configured to bond the secondary wafer 30 to the base wafer 54. One suitable wafer bonder is a semiautomatic production bonder manufactured by EV Group Inc. of Phoenix, Ariz. Next, the underfill layers 94 are applied to the base wafer 54 mounted to the wafer bonder.

Next, as shown in the center block of FIG. 6E the secondary wafer 30 is aligned with and bonded to the base wafer using the wafer bonder. As also shown in the next to last block of FIG. 6E, the terminal contacts 18, are formed on the base dice 12 using a ball bumper and solder preforms as previously described. As shown in the last block of FIG. 6E, the components 10 are singulated from the base wafer 54 using a suitable process such as sawing.

3 Die Stack—Miniscus Bumps/Flip Chip Bonder (M8)

Figure 6F:
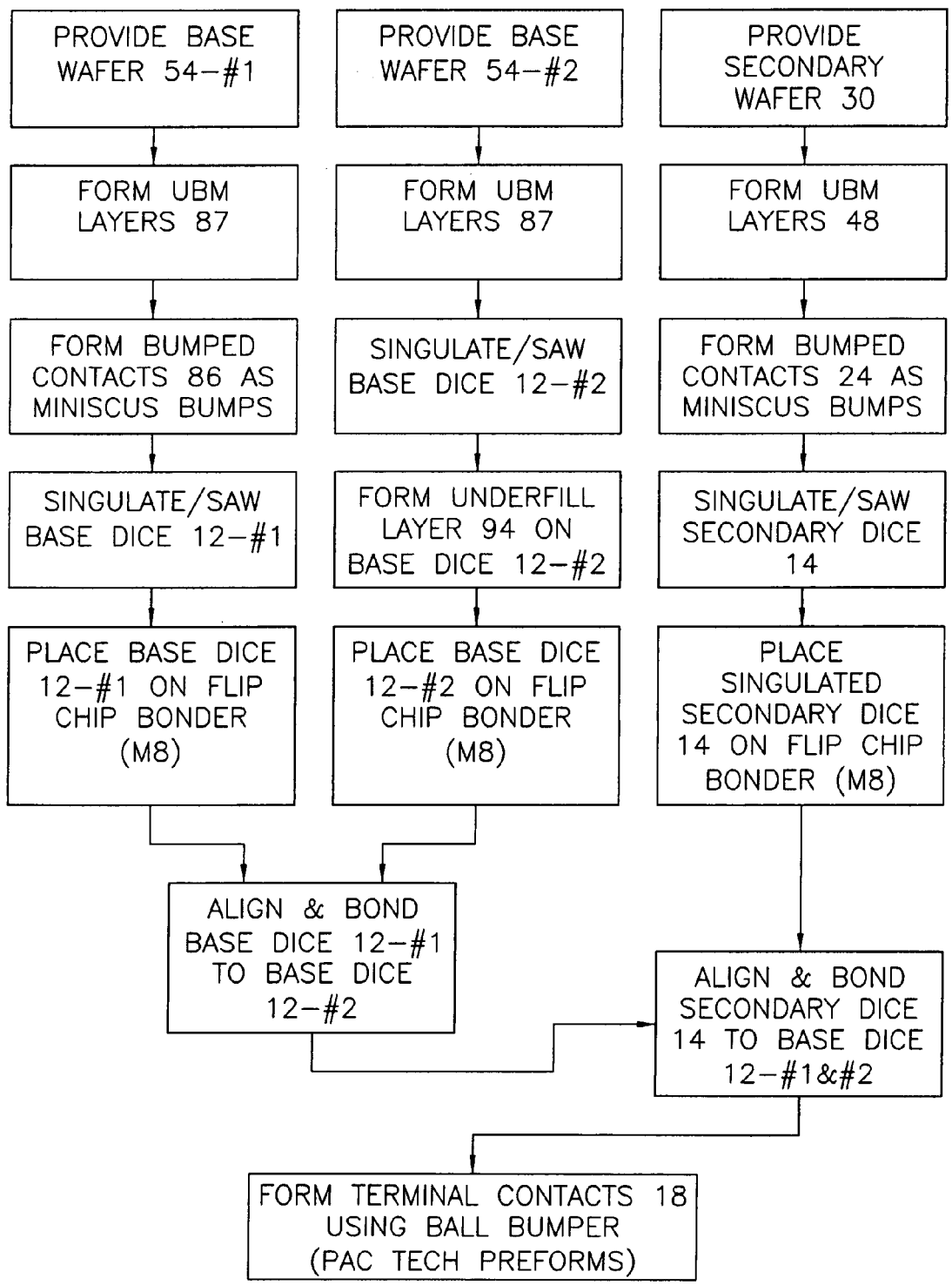

FIG. 6F describes a fabrication process for a three die component, such as component 10E (FIG. 4E), component 10F (FIG. 4F) or component 10H (FIG. 4H). In addition, a die level bonding process is described using a pair of singulated base dice 12 and a singulated secondary dice 14. Alternately, the process could be for a pair of secondary dice 14 and a single base die 12. As another alternative, the process could be for a single base die 12, a single secondary die 14 and a cap plate 134F (FIG. 4F) or 134H (FIG. 4H). Further, the process uses meniscus bumps for the bumped contacts 24 on the secondary dice 14 and also for the bumped contacts 86 on one of the base dice 12.

As shown on the right hand side of FIG. 6F, the secondary wafer 30 (FIG. 2) is provided. In addition, the UBM layers 48 (FIG. 2B) for the bumped contacts 24 (FIG. 2C) are formed on the die contacts 46 (FIG. 2B) using a suitable process, such as electroless deposition. Next, the bumped contacts 24 (FIG. 2C) are formed on the secondary dice 14 using a wave soldering process, as previously described. As also shown on the right hand side of FIG. 6F, the secondary dice 14 are singulated from the secondary wafer 30 using a suitable process such as sawing.

As shown on the right side of FIG. 6F, the base wafer 54—#1 (FIG. 3) is provided. The base wafer 54—#1 can include the conductive vias 26 (FIG. 3K) and the insulating layers 80 (FIG. 3H) formed as previously described. In addition, the base wafer 54—#1 can include the redistribution conductors 28 (FIG. 3A), and the redistribution insulating layers 68, 70 formed as previously described. As also shown on the right, the UBM layers 87 (FIG. 3K) for the bumped contacts 86 (FIG. 3K) are formed on the conductive vias 26. In addition, the bumped contacts 86 are formed as meniscus bumps using a wave soldering process as described above. Base wafer 54—#1 is then singulated into the base dice 12—#1, and the base dice 12—#1 are placed in the flip chip bonder, such as the previously described "M8" flip chip bonder manufactured by Research Devices of Piscataway, N.J.

As shown in the center column of FIG. 6F, the base wafer 54—#2 is provided, the UBM layers 87 are formed, and the base dice 12—#2 are singulated. The underfill layers 94 are then formed on the base dice 12—#2, and the base dice 12—#2 are placed in the flip chip bonder. The base dice 12—#1 are then bonded to the base dice 12—#2 using the flip chip bonder to bond the bumped contacts 86 on the base dice 12—#1 to the UBM layers 87 on the base dice 12—#2.

As shown on the right hand side of FIG. 6F, the singulated secondary dice 14 are placed in the flip chip bonder, and the secondary dice 14 are bonded to the bonded base dice 12—#1 and #2. As shown in the last box of FIG. 6F, the terminal contacts 18 are formed on the base dice 12—#1 using a ball bumper and solder preforms as previously described.

3 Die Stack—Ball Bumper or Miniscus Bumps/Flip Chip Bonder (M8) or (Datacon)

Figure 6G:
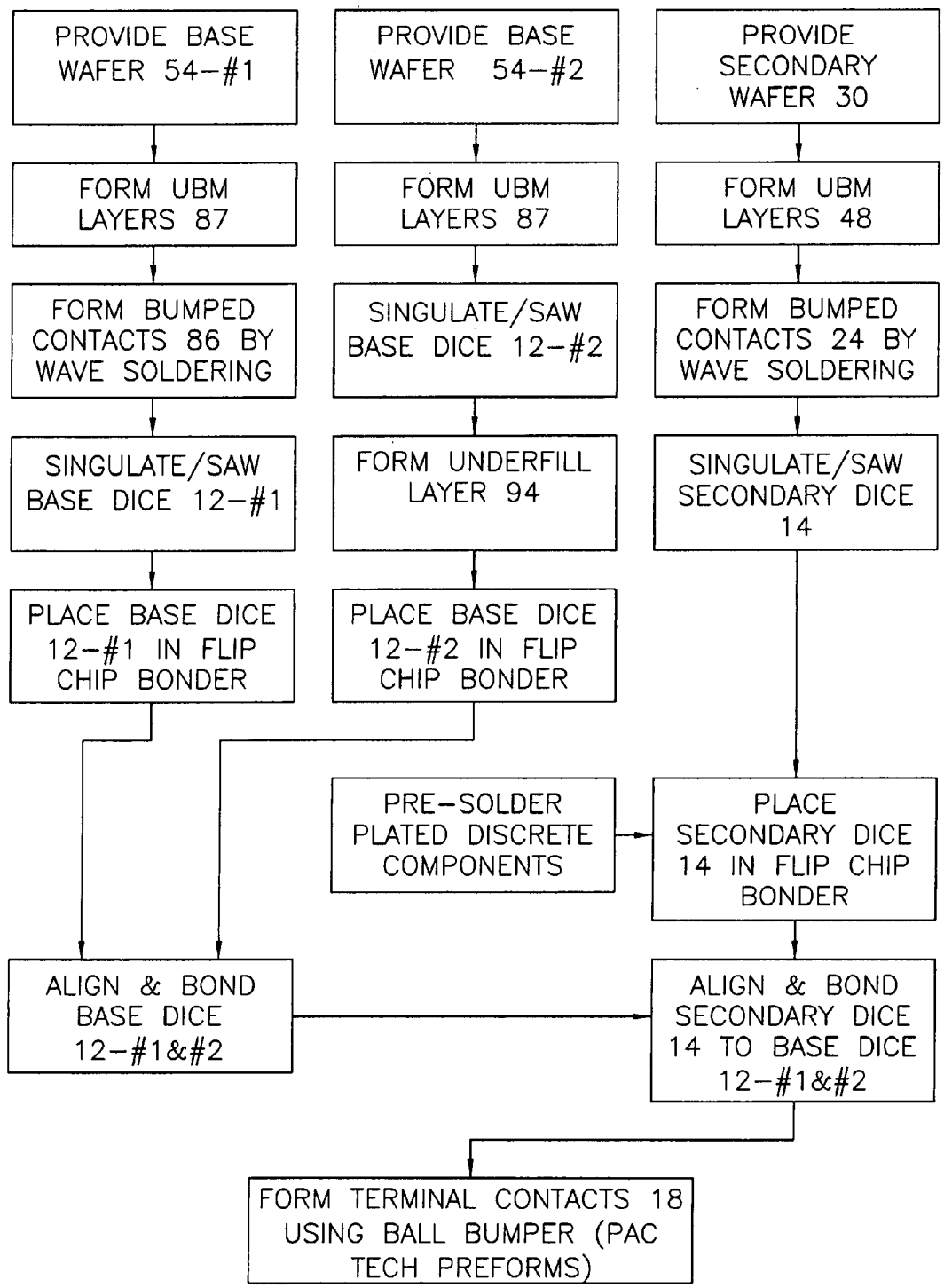

FIG. 6G describes a fabrication process for a three die component, such as component 10H (FIG. 4H) that also includes electronic components 138H (FIG. 4H), such as capacitors. Further, the process uses meniscus bumps for the bumped contacts 24 on the secondary dice 14 and also for the bumped contacts 86 on one of the base dice 12.

As shown on the right hand side of FIG. 6G, the secondary wafer 30 (FIG. 2) is provided. In addition, the UBM layers 48 (FIG. 2B) for the bumped contacts 24 (FIG. 2C) are formed on the die contacts 46 (FIG. 2B) using a suitable process, such as electroless deposition. Next, the bumped contacts 24 (FIG. 2C) are formed on the secondary dice 14 using a wave soldering process, as previously described. As also shown on the right hand side of FIG. 6G, the secondary dice 14 are singulated from the secondary wafer 30 using a suitable process such as sawing.

As shown on the right side of FIG. 6G, the base wafer 54—#1 (FIG. 3) is provided. The base wafer 54—#1 can include the conductive vias 26 (FIG. 3K) and the insulating layers 80 (FIG. 3H) formed as previously described. In addition, the base wafer 54—#1 can include the redistribution conductors 28 (FIG. 3A), and the redistribution insulating layers 68, 70 formed as previously described. As also shown on the right, the UBM layers 87 (FIG. 3K) for the bumped contacts 86 (FIG. 3K) are formed on the conductive vias 26. In addition, the bumped contacts 86 are formed as meniscus bumps using a wave soldering process as described above. Base wafer 54—#1 is then singulated into the base dice 12—#1, and the base dice 12—#1 are placed in the flip chip bonder, such as the previously described "M8" flip chip bonder manufactured by Research Devices of Piscataway, N.J., or the flip chip bonder manufactured by Datacon Semiconductor Equipment GmbH, Radfeld, AT.

As shown in the center column of FIG. 6G, the base wafer 54—#2 is provided, the UBM layers 87 are formed, and the base dice 12—#2 are singulated. The underfill layer 94 is then formed on the base dice 12—#2, and the dice are placed in the flip chip bonder. The base dice 12—#1 are then aligned and bonded to the base dice 12—#2 using the flip chip bonder to bond the bumped contacts 86 on the base dice 12—#1 to the UBM layers 87 on the base dice 12—#2.

As shown on the middle portion of FIG. 6G, pre-solder plated components 138H (FIG. 4H) are bonded to the singulated secondary dice 14. The singulated secondary dice 14 are placed in the flip chip bonder, and the secondary dice 14 are bonded to the bonded base dice 12—#1 and #2. As shown in the last box of FIG. 6G, the terminal contacts 18 are formed on the base dice 12—#1 using a ball bumper and solder preforms as previously described.

Figure 7A:
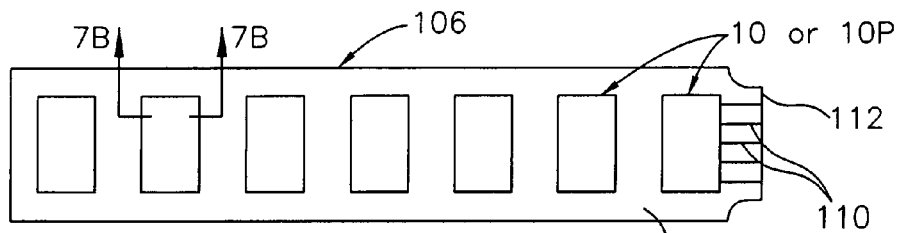
FIG. 7A is a schematic plan view of a module system incorporating components constructed in accordance with the invention.
Figure 7B:
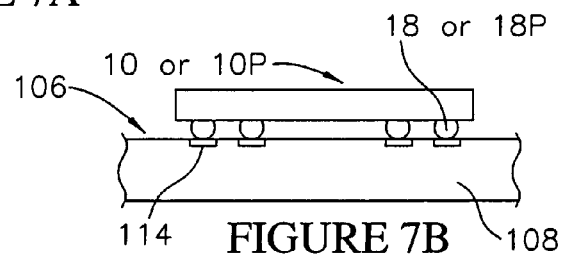
FIG. 7B is a schematic cross sectional view of the module system taken along section line 7B-7B of FIG. 7A.

Referring to FIGS. 7A and 7B, a multi chip module system 106 that includes multiple components 10 is illustrated. The multi chip module system 106 can be configured for performing a specific function such as memory storage. The multi chip module system 106 includes a module substrate 108 having patterns of electrodes 114 (FIG. 7B) configured for flip chip mounting the components 10 to the module substrate 108. The terminal contacts 18 on the components 10 can be bonded to the electrodes 114 on the module substrate 108 using a suitable bonding process, such as solder reflow, thermode bonding or conductive polymer bonding. The electrodes 114 are in electrical communication with conductors 110 formed on the module substrate 108 in a required circuit pattern. In addition, the conductors 110 are in electrical communication with an edge connector 112 which provides connection points from the outside to the multi chip module system 106.

Figure 8:
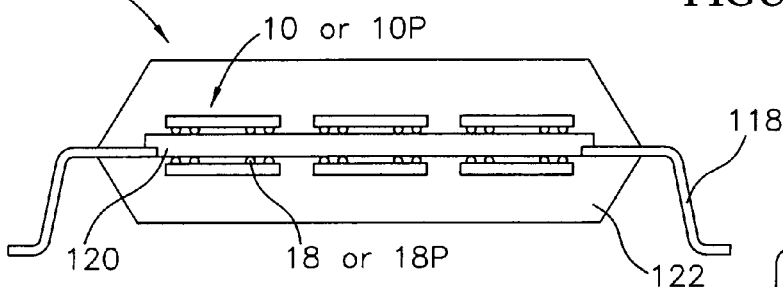
FIG. 8 is a schematic cross sectional view of a system in a package incorporating components constructed in accordance with the invention.

Referring to FIG. 8, a system in a package 116 (SIP) that includes multiple components 10 is illustrated. The system in a package 116 can be configured to perform a desired electrical function such as micro processing. In addition, each component 10 can have a different electrical configuration, such as a micro controller, a microprocessor or a flash memory. The system in a package 116 includes a package substrate 120 wherein the components 10 are flip chip mounted. The package substrate 120 also includes electrodes and conductors (not shown) which electrically connect the components 10 in a required electrical configuration. The package substrate 120 also includes package leads 118 in electrical communication with the components 10. The system in a package 116 also includes a package body 122 formed of a molded plastic, or other suitable material, which encapsulates the package substrate 120 and the components 10.

Figure 9:
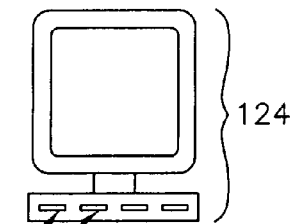
FIG. 9 is a schematic cross sectional view of a computer system incorporating components constructed in accordance with the invention.

Referring to FIG. 9, a computer system 124 includes one or more components 10, which can be mounted to the computer system 124 in a suitable manner. In addition, the components 10 can be configured to perform a desired function in the computer system 124 such as memory, storage or micro processing.

Figure 10:
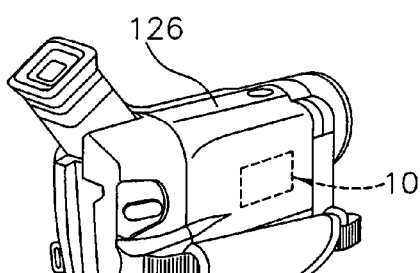
FIG. 10 is a schematic cross sectional view of a camcorder system incorporating components constructed in accordance with the invention.

Referring to FIG. 10, a digital camcorder system 126 includes one or more components 10, which can be mounted in a suitable manner, and configured to perform a desired circuit function in the camcorder system 126.

Figure 11:
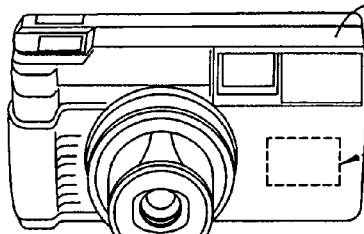
FIG. 11 is a schematic cross sectional view of a camera system incorporating components constructed in accordance with the invention.

Referring to FIG. 11, a camera system 128 includes one or more components 10, which can be mounted in a suitable manner, and configured to perform a desired circuit function in the camera system 128.

Figure 12:
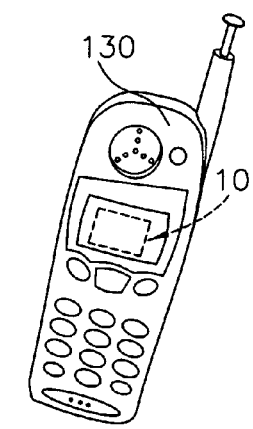
FIG. 12 is a schematic cross sectional view of a cellular phone system incorporating components constructed in accordance with the invention.

Referring to FIG. 12, a cellular phone system 130 includes one or more components 10, which can be mounted to in a suitable manner, and configured to perform a desired circuit function in the cellular phone system 130.

Figure 13:
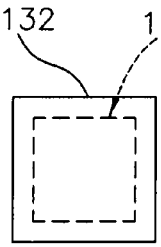
FIG. 13 is a schematic cross sectional view of a medical device system incorporating components constructed in accordance with the invention.

Referring to FIG. 13, a medical device system 132 includes one or more components 10, which can be mounted in a suitable manner, and configured to perform a desired circuit function in the medical device system 132.

Thus the invention provides improved multi-die semiconductor components, methods for fabricating the components, and systems incorporating the components. While the invention has been described with reference to certain preferred embodiments, as will be apparent to those skilled in the art, certain changes and modifications can be made without departing from the scope of the invention as defined by the following claims.

The invention claimed is:

1. A semiconductor component comprising:
   a plate having a plurality of contacts;
   a first die attached to the plate comprising a substrate having a back side, and a plurality of conductive vias in the substrate in electrical communication with the contacts on the plate; and
   a second die having a circuit side attached to the back side in electrical communication with the conductive vias.

2. The semiconductor component of claim 1 further comprising an underfill layer bonding the plate to the first die.

3. The semiconductor component of claim 1 wherein the plate comprises a plurality of conductors and the contacts comprise bumped contacts in electrical communication with the conductors and bonded to the conductive vias.

4. The semiconductor component of claim 1 wherein the first die comprises a thinned die.

5. The semiconductor component of claim 1 wherein the second die comprises a thinned die.

6. The semiconductor component of claim 1 further comprising a plurality of terminal contacts on the second die in electrical communication with the conductive vias.

7. The semiconductor component of claim 1 further comprising at least one electronic component on the plate in electrical communication with the first contacts.

8. The semiconductor component of claim 1 wherein the plate includes a plurality of interlevel conductors in electrical communication with the contacts and an electronic component on the plate.

9. A semiconductor component comprising:
   a base die comprising a plurality of first contacts and a plurality of first conductive vias in electrical communication with the first contacts;
   a plate attached to the base die comprising a plurality of second contacts bonded to the to the first conductive vias on the base die and a plurality of conductors in electrical communication with the second contacts configured to electrically connect selected first contacts to one another;
   a secondary die stacked on the base die comprising a plurality of third contacts in electrical communication with the first conductive vias and a plurality of second conductive vias in electrical communication with the third contacts; and
   a plurality of terminal contacts on the secondary die in electrical communication with the second conductive vias.

10. The semiconductor component of claim 9 further comprising an underfill layer attaching the plate to the base die and encapsulating the second contacts.

11. The semiconductor component of claim 9 wherein the base die and the secondary die comprise thinned dice.

12. The semiconductor component of claim 9 wherein the base die comprises a thinned die.

13. The semiconductor component of claim 9 wherein the secondary die comprises a thinned die.

14. A semiconductor component comprising:
   a base die comprising a plurality of first conductive vias and a plurality of first contacts in electrical communication with the first conductive vias;
   a plate comprising a plurality of bumped contacts bonded to the first conductive vias and a plurality of conductors in electrical communication with the bumped contacts; and a secondary die stacked on the base die having a plurality of second conductive vias bonded to the first contacts on the base die and a plurality of second contacts in electrical communication with the second conductive vias.

15. The semiconductor component of claim 14 further comprising a plurality of terminal contacts on secondary die in electrical communication with the second contacts.

16. The semiconductor component of claim 14 further comprising an underfill layer attaching the plate to the base die and encapsulating the bumped contacts.

17. The semiconductor component of claim 14 wherein the base die and the secondary die comprise thinned dice.

18. The semiconductor component of claim 14 wherein the conductors are configured to electrically connect selected first contacts to one another.

19. The semiconductor component of claim 14 further comprising at least one electronic component on the plate in electrical communication with a conductor.

20. The semiconductor component of claim 14 wherein the conductors comprise at least one interlevel conductor.

* * * * *

UNITED STATES PATENT AND TRADEMARK OFFICE
CERTIFICATE OF CORRECTION

| | | |
|---|---|---|
| PATENT NO. | : 7,498,675 B2 | Page 1 of 1 |
| APPLICATION NO. | : 11/701927 | |
| DATED | : March 3, 2009 | |
| INVENTOR(S) | : Farnworth et al. | |

It is certified that error appears in the above-identified patent and that said Letters Patent is hereby corrected as shown below:

In column 24, line 38, in Claim 9, delete "to the to the" and insert -- to the --, therefor.

Signed and Sealed this

Fifth Day of May, 2009

JOHN DOLL
*Acting Director of the United States Patent and Trademark Office*